(12) United States Patent
Arena et al.

(10) Patent No.: US 9,481,943 B2
(45) Date of Patent: Nov. 1, 2016

(54) GALLIUM TRICHLORIDE INJECTION SCHEME

(71) Applicant: Soitec, Bernin (FR)

(72) Inventors: Chantal Arena, Mesa, AZ (US); Christiaan Werkhoven, Gilbert, AZ (US)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 13/680,241

(22) Filed: Nov. 19, 2012

(65) Prior Publication Data

US 2013/0104802 A1 May 2, 2013

Related U.S. Application Data

(60) Division of application No. 13/288,396, filed on Nov. 3, 2011, now Pat. No. 8,323,407, which is a
(Continued)

(51) Int. Cl.
*C23C 16/30* (2006.01)
*C23C 16/44* (2006.01)
(Continued)

(52) U.S. Cl.
CPC ............. *C30B 25/10* (2013.01); *C23C 16/303* (2013.01); *C23C 16/4411* (2013.01);
(Continued)

(58) Field of Classification Search
CPC ....... C30B 25/02; C30B 25/14; C30B 25/00; C30B 25/165; C30B 23/00; C30B 23/02; C30B 29/38; C30B 25/08; C30B 25/10; C30B 25/105; C30B 29/40–29/406; C30B 35/00; C30B 23/06–23/066; C23C 16/455–16/4551; C23C 16/303; C23C 16/4411; C23C 16/4412; C23C 16/448–16/452; C23C 16/45504; C23C 16/45512; C23C 16/45514; C23C 16/45561; C23C 16/45563–16/4558; C23C 16/45574; C23C 16/45587–16/45591; C23C 16/45593; H01L 21/02389; H01L 21/0262; H01L 21/02631; H01L 21/02271–21/0228; H01L 21/0237; H01L 21/0242; H01L 21/0245–21/02458; H01L 21/02538–21/0254; H01L 31/1808; H01L 31/184–31/1856; H01L 33/0062–33/0079; H01L 33/0083–33/0095; B82Y 15/00; H01S 2304/04; Y10S 148/065; Y10S 148/11; Y10S 261/65
USPC ............ 118/715, 722, 724, 726; 156/345.29, 156/345.33, 345.34, 345.37
See application file for complete search history.

(56) References Cited

U.S. PATENT DOCUMENTS 3,075,494 A * 1/1963 Toulmin, Jr. .................. 118/715
3,146,137 A 8/1964 Williams ....................... 148/175
(Continued)

FOREIGN PATENT DOCUMENTS

CN 101023314 A 8/2007
EP 0 870 852 A1 10/1998
(Continued)

OTHER PUBLICATIONS

A. Y. Timoshkin et al., "A Theoretical Approach to the Single-Source Precursor Concept: Quntum Chemical Modeling of Gas Phase Reactions," Journal of Crystal Growth 222 (2001) pp. 170-182.*
(Continued)

*Primary Examiner* — Parviz Hassanzadeh
*Assistant Examiner* — Stanislav Antolin
(74) *Attorney, Agent, or Firm* — TraskBritt

(57) ABSTRACT

A system for epitaxial deposition of a Group III-V semiconductor material that includes gallium. The system includes sources of the reactants, one of which is a gaseous Group III precursor having one or more gaseous gallium precursors and another of which is a gaseous Group V component, a reaction chamber wherein the reactants combine to deposit Group III-V semiconductor material, and one or more heating structures for heating the gaseous Group III precursors prior to reacting to a temperature to decompose substantially all dimers, trimers or other molecular variations of such precursors into their monomer forms.

18 Claims, 9 Drawing Sheets

Related U.S. Application Data continuation of application No. 12/305,534, filed as application No. PCT/US2007/084845 on Nov. 15, 2007, now Pat. No. 8,197,597.

(60) Provisional application No. 60/866,923, filed on Nov. 22, 2006, provisional application No. 60/942,832, filed on Jun. 8, 2007.

(51) Int. Cl.

| | | |
|---|---|---|
| *C23C 16/455* | (2006.01) | |
| *C30B 25/10* | (2006.01) | |
| *C30B 29/40* | (2006.01) | |
| *C30B 35/00* | (2006.01) | |
| *H01L 21/02* | (2006.01) | |
| *C30B 25/14* | (2006.01) | |

(52) U.S. Cl.
CPC .... *C23C 16/4412* (2013.01); *C23C 16/45504* (2013.01); *C23C 16/45593* (2013.01); *C30B 25/14* (2013.01); *C30B 29/406* (2013.01); *C30B 35/00* (2013.01); *H01L 21/0254* (2013.01); *H01L 21/0262* (2013.01)

(56) References Cited

U.S. PATENT DOCUMENTS

| | | | |
|---|---|---|---|
| 3,476,152 A | 11/1969 | Locke | 137/625.48 |
| 3,699,666 A | 10/1972 | Calvert et al. | 34/571 |
| 3,724,490 A | 4/1973 | Kramer | 137/340 |
| 4,033,550 A | 7/1977 | Wheatley et al. | 251/328 |
| 4,264,406 A | 4/1981 | Hackskaylo | 117/83 |
| 4,311,545 A | 1/1982 | Bugl et al. | 117/102 |
| 4,362,560 A | 12/1982 | Abrjutin et al. | 75/407 |
| 4,498,953 A | 2/1985 | Cook et al. | 156/646 |
| 4,519,999 A | 5/1985 | Coleman et al. | 423/337 |
| 4,545,512 A | 10/1985 | Shapland et al. | 222/600 |
| 4,669,821 A | 6/1987 | Blair et al. | 385/142 |
| 4,716,130 A | 12/1987 | Johnston, Jr. et al. | 438/23 |
| 4,761,269 A | 8/1988 | Conger et al. | |
| 4,792,467 A | 12/1988 | Melas et al. | 427/248.1 |
| 4,798,701 A | 1/1989 | David | 420/528 |
| 4,802,441 A | 2/1989 | Waugh | |
| 4,828,224 A * | 5/1989 | Crabb | C30B 25/10 |
| | | | 118/715 |
| 4,839,145 A | 6/1989 | Gale et al. | 118/725 |
| 4,844,006 A * | 7/1989 | Page et al. | 118/719 |
| 4,881,719 A | 11/1989 | Bowman | 251/328 |
| 4,911,102 A * | 3/1990 | Manabe et al. | 118/719 |
| 4,991,540 A * | 2/1991 | Jurgensen et al. | 118/715 |
| 4,993,361 A * | 2/1991 | Unvala | 118/723 FI |
| 5,035,767 A * | 7/1991 | Nishizawa | 117/99 |
| 5,047,565 A * | 9/1991 | Jones et al. | 556/19 |
| 5,077,875 A * | 1/1992 | Hoke et al. | 118/715 |
| 5,080,549 A | 1/1992 | Goodwin et al. | 414/744.8 |
| 5,136,978 A | 8/1992 | Ahern et al. | 118/725 |
| 5,151,395 A | 9/1992 | Tom | 502/67 |
| 5,202,283 A * | 4/1993 | Younger et al. | 117/99 |
| 5,204,314 A * | 4/1993 | Kirlin et al. | 505/447 |
| 5,209,952 A * | 5/1993 | Erdmann et al. | 427/255.6 |
| 5,221,556 A * | 6/1993 | Hawkins | C30B 25/14 |
| | | | 118/715 |
| 5,248,800 A * | 9/1993 | Smit et al. | 556/1 |
| 5,250,148 A | 10/1993 | Nishizawa et al. | 156/611 |
| 5,298,759 A * | 3/1994 | Brewer et al. | 250/492.1 |
| 5,300,185 A | 4/1994 | Hori et al. | 158/610 |
| 5,383,970 A * | 1/1995 | Asaba et al. | 118/726 |
| 5,447,569 A | 9/1995 | Hiskes et al. | 118/726 |
| 5,453,494 A * | 9/1995 | Kirlin et al. | 534/15 |
| 5,458,086 A * | 10/1995 | Smith et al. | 117/200 |
| 5,668,395 A | 9/1997 | Razeghi | 257/94 |
| 5,711,816 A * | 1/1998 | Kirlin et al. | 118/726 |
| 5,782,980 A | 7/1998 | Allen et al. | 118/715 |
| 5,820,641 A | 10/1998 | Gu et al. | 55/434.4 |
| 5,904,958 A * | 5/1999 | Dick et al. | 118/724 |
| 5,909,036 A | 6/1999 | Tanaka et al. | 117/586 |
| 5,935,283 A * | 8/1999 | Sweeney | B01D 45/00 |
| | | | 261/112.1 |
| 5,948,485 A | 9/1999 | Amano et al. | 427/571 |
| 6,066,204 A | 5/2000 | Haven | 117/89 |
| 6,073,366 A | 6/2000 | Aswad | 34/367 |
| 6,080,241 A | 6/2000 | Li et al. | 118/715 |
| 6,093,252 A * | 7/2000 | Wengert | B01J 3/006 |
| | | | 118/715 |
| 6,110,809 A | 8/2000 | Sze et al. | 438/503 |
| 6,126,719 A | 10/2000 | Sturgill et al. | 75/586 |
| 6,137,231 A * | 10/2000 | Anders et al. | 118/723 E |
| 6,153,010 A | 11/2000 | Kiyoku et al. | 117/95 |
| 6,153,012 A | 11/2000 | Rupp et al. | 118/715 |
| 6,179,913 B1 | 1/2001 | Solomon et al. | 117/99 |
| 6,206,971 B1 | 3/2001 | Umotoy et al. | 118/715 |
| 6,207,844 B1 * | 3/2001 | Kouvetakis et al. | 556/1 |
| 6,214,116 B1 | 4/2001 | Shing | |
| 6,218,212 B1 * | 4/2001 | Saito et al. | 118/727 |
| 6,218,280 B1 * | 4/2001 | Kryliouk et al. | 438/607 |
| 6,221,742 B1 | 4/2001 | Park et al. | 438/488 |
| 6,274,854 B1 | 8/2001 | Franklin et al. | 219/546 |
| 6,274,891 B1 | 8/2001 | Tanaka et al. | 257/99 |
| 6,290,774 B1 | 9/2001 | Solomon et al. | 117/586 |
| 6,331,211 B1 * | 12/2001 | Xu et al. | 118/719 |
| 6,350,666 B2 * | 2/2002 | Kryliouk | 438/604 |
| 6,406,540 B1 | 6/2002 | Harris et al. | 117/89 |
| 6,406,677 B1 * | 6/2002 | Carter | C01B 21/06 |
| | | | 423/276 |
| 6,495,707 B1 | 12/2002 | Leese et al. | 556/1 |
| 6,520,745 B1 | 2/2003 | Yamamoto et al. | 417/44.1 |
| 6,527,857 B1 | 3/2003 | Pankove | |
| 6,620,256 B1 | 9/2003 | Arno et al. | 134/210 |
| 6,632,725 B2 | 10/2003 | Trassoudaine et al. | 438/479 |
| 6,689,252 B1 | 2/2004 | Shamouilian et al. | 204/157.15 |
| 6,733,591 B2 * | 5/2004 | Anderson | 118/715 |
| 6,815,362 B1 | 11/2004 | Wong et al. | 438/706 |
| 6,845,619 B2 | 1/2005 | Olander | 60/459 |
| 6,855,916 B1 | 2/2005 | Matthews et al. | |
| 6,867,067 B2 | 3/2005 | Ghyselen et al. | 438/649 |
| 6,867,112 B1 | 3/2005 | Ishibashi et al. | 438/479 |
| 6,893,507 B2 | 5/2005 | Goodman et al. | 118/107 |
| 6,906,351 B2 * | 6/2005 | Kryliouk et al. | 257/78 |
| 6,911,083 B2 | 6/2005 | Hara | 117/91 |
| 6,921,062 B2 | 7/2005 | Gregg et al. | 261/23.1 |
| 6,926,775 B2 | 8/2005 | Carpenter et al. | 118/733 |
| 6,967,355 B2 * | 11/2005 | Kryliouk et al. | 257/103 |
| 7,001,791 B2 * | 2/2006 | Kryliouk et al. | 438/46 |
| 7,033,858 B2 * | 4/2006 | Chai et al. | 438/106 |
| 7,261,118 B2 * | 8/2007 | Birtcher | C23C 16/4481 |
| | | | 137/13 |
| 7,396,415 B2 * | 7/2008 | Arena | C23C 16/303 |
| | | | 118/715 |
| 7,621,999 B2 | 11/2009 | Koukitu et al. | |
| 7,632,542 B2 | 12/2009 | Adomaitis | 427/248.1 |
| 8,187,679 B2 * | 5/2012 | Dickey | C23C 16/452 |
| | | | 427/569 |
| 8,268,646 B2 * | 9/2012 | Kryliouk et al. | 438/20 |
| 8,388,755 B2 | 3/2013 | Arena et al. | |
| 8,741,385 B2 | 6/2014 | Arena et al. | |
| 2001/0006845 A1 * | 7/2001 | Kryliouk | 438/607 |
| 2001/0008285 A1 | 7/2001 | Tsujimura et al. | 257/103 |
| 2002/0045362 A1 | 4/2002 | Yang et al. | 438/791 |
| 2002/0090816 A1 | 7/2002 | Ashby et al. | 438/686 |
| 2002/0108714 A1 | 8/2002 | Doering et al. | 156/104 |
| 2003/0015137 A1 | 1/2003 | Sakai et al. | 118/715 |
| 2003/0024475 A1 * | 2/2003 | Anderson | 118/715 |
| 2003/0042457 A1 | 3/2003 | Yoo | 251/309 |
| 2003/0094446 A1 | 5/2003 | Tay et al. | 219/345.51 |
| 2003/0136365 A1 | 7/2003 | Komi et al. | 123/142.5 R |
| 2003/0138367 A1 | 7/2003 | Brady et al. | 423/411 |
| 2003/0168001 A1 | 9/2003 | Sneh | 117/86 |
| 2003/0221617 A1 | 12/2003 | Lim | |
| 2004/0007188 A1 | 1/2004 | Burkhart et al. | 118/733 |
| 2004/0182315 A1 | 9/2004 | Laflamme et al. | 118/715 |
| 2004/0191142 A1 | 9/2004 | Takemura et al. | 423/9 |
| 2004/0194707 A1 * | 10/2004 | Takahashi et al. | 118/722 |
| 2004/0201030 A1 * | 10/2004 | Kryliouk et al. | 257/103 |

(56) References Cited

U.S. PATENT DOCUMENTS

| | | | |
|---|---|---|---|
| 2004/0209402 A1* | 10/2004 | Chai et al. | 438/122 |
| 2004/0235268 A1 | 11/2004 | Letertre et al. | 438/2 |
| 2005/0000406 A1 | 1/2005 | Janzen et al. | 117/81 |
| 2005/0032345 A1* | 2/2005 | Kryliouk et al. | 438/604 |
| 2005/0039794 A1* | 2/2005 | Birtcher | C23C 16/4481 137/268 |
| 2005/0087746 A1* | 4/2005 | Kryliouk et al. | 257/79 |
| 2005/0163928 A1 | 7/2005 | Otsuka et al. | 427/725 |
| 2005/0221021 A1 | 10/2005 | Strang | 427/569 |
| 2005/0221618 A1* | 10/2005 | AmRhein | C23C 16/45591 438/710 |
| 2005/0242061 A1 | 11/2005 | Fukuda | 216/67 |
| 2005/0258459 A1 | 11/2005 | Hwang et al. | 257/280 |
| 2006/0008941 A1 | 1/2006 | Haskell et al. | 438/93 |
| 2006/0011135 A1 | 1/2006 | Dmitriev et al. | 118/718 |
| 2006/0040475 A1 | 2/2006 | Emerson | 438/478 |
| 2006/0042544 A1 | 3/2006 | Hasebe et al. | 118/715 |
| 2006/0047132 A1* | 3/2006 | Shenai-Khatkhate et al. | 556/1 |
| 2006/0099123 A1 | 5/2006 | Seeley et al. | 423/248 |
| 2006/0115595 A1 | 6/2006 | Shenai-Khatkhate et al. | 427/248.1 |
| 2006/0121194 A1 | 6/2006 | Aiso | 427/248.1 |
| 2006/0131606 A1 | 6/2006 | Cheng | 257/190 |
| 2006/0169996 A1 | 8/2006 | D'Evelyn et al. | 257/237 |
| 2006/0228473 A1 | 10/2006 | Satoh et al. | 427/248.1 |
| 2006/0275546 A1* | 12/2006 | Arena | C23C 16/303 427/248.1 |
| 2007/0108466 A1* | 5/2007 | Kryliouk et al. | 257/103 |
| 2007/0151509 A1 | 7/2007 | Park et al. | 117/200 |
| 2007/0257334 A1 | 11/2007 | Leibiger et al. | 257/237 |
| 2008/0018004 A1* | 1/2008 | Steidl | C23C 16/4482 261/126 |
| 2008/0026162 A1* | 1/2008 | Dickey | C23C 16/452 427/569 |
| 2008/0095675 A1 | 4/2008 | Hartung | 422/171 |
| 2008/0149942 A1 | 6/2008 | Yi et al. | 257/79 |
| 2008/0163816 A1* | 7/2008 | Toda et al. | 118/715 |
| 2008/0248200 A1* | 10/2008 | Arena | C23C 16/303 427/255.28 |
| 2009/0178611 A1 | 7/2009 | Arena et al. | 117/99 |
| 2009/0205563 A1 | 8/2009 | Arena et al. | 117/102 |
| 2009/0223441 A1 | 9/2009 | Arena et al. | 117/88 |
| 2009/0223442 A1 | 9/2009 | Arena et al. | 117/99 |
| 2009/0223453 A1 | 9/2009 | Arena et al. | 118/715 |
| 2009/0234420 A1 | 9/2009 | Wahlstrand et al. | |
| 2009/0283002 A1 | 11/2009 | Schultze | |
| 2009/0283029 A1 | 11/2009 | Arena et al. | |
| 2010/0029064 A1* | 2/2010 | Kryliouk et al. | 438/478 |
| 2010/0242835 A1 | 9/2010 | Arena et al. | 117/102 |
| 2010/0258053 A1 | 10/2010 | Arena et al. | 118/724 |
| 2011/0277681 A1 | 11/2011 | Arena et al. | |
| 2012/0048182 A1 | 3/2012 | Arena et al. | |
| 2012/0083100 A1 | 4/2012 | Bertram et al. | |
| 2013/0047918 A1 | 2/2013 | Bertram et al. | |

FOREIGN PATENT DOCUMENTS

| | | | |
|---|---|---|---|
| EP | 2570523 A1 * | 3/2013 | |
| JP | 59-188118 A | 10/1984 | |
| JP | 61-254225 A | 11/1986 | |
| JP | 63-316425 A | 12/1988 | |
| JP | 4-132681 A | 5/1992 | |
| JP | H10182282 A | 7/1998 | |
| JP | 11312650 A | 11/1999 | |
| JP | 2000-269142 A | 9/2000 | |
| JP | 2000269142 A * | 9/2000 | |
| JP | 2001-119106 A | 4/2001 | |
| JP | 2001192300 A | 7/2001 | |
| JP | 2002252176 A | 9/2002 | |
| JP | 2002-371361 A | 12/2002 | |
| JP | 2003-335518 A | 11/2003 | |
| JP | 2003335518 A * | 11/2003 | |
| JP | 2004241412 A | 8/2004 | |
| JP | 2005-097045 A | 4/2005 | |
| JP | 2005097045 A * | 4/2005 | |
| JP | 2006073578 A | 3/2006 | |
| JP | 2006-179653 A | 7/2006 | |
| JP | 2006179653 A * | 7/2006 | |
| JP | 2006290662 A | 10/2006 | |
| JP | 2008060536 A | 3/2008 | |
| WO | WO 9966565 A1 * | 12/1999 | |
| WO | WO 00/68471 A1 | 11/2000 | |
| WO | WO 2004025716 A1 * | 3/2004 | |
| WO | WO 2005020304 A1 * | 3/2005 | |
| WO | WO 2008016836 A2 * | 2/2008 | C23C 16/452 |
| WO | WO 2009/082608 A1 | 7/2009 | |

OTHER PUBLICATIONS

Y. Okamoto, "Theoretical Study on the Precursors of Group-III Nitrides," Journal of Crystal Growth 191 (1998) pp. 405-412.*

R.M. Watwe et al., Gas-Phase Chemistry of Metalorganic and Nitrogen-Bearing Compounds, Journal of Crystal Growth 221 (2000) pp. 751-757.*

K. Matsumoto et al, "Growth Mechanism of Atmospheric Pressure MOVPE of GaN and Its Alloys: Gas Phase Chemistry and Its Impact on Reactor Design," Journal of Crystal Growth 272 (2004) pp. 360-369.*

Michael D. Reed. "Growth and Characterization of Free-Standing Gallium Nitride Substrates by the Hydride-Metalorganic Vapor Phase Epitaxy Technique." Doctoral Thesis, Chemical Engineering, University of Florida. 2002. pp. 1-265. Source location: The University of Florida Libraries. http://uf.catalog.fcla.edu/uf.jsp?st=UF028834430&ix=pm&I=0&V=D&pm=1.*

O. Ambacher. "Review Article: Growth and Applications of Group III-Nitrides." Journal of Physics D: Applied Physics 31 (1998) pp. 2653-2710.*

P Shi "Thermo-Calc® Database Guide (Aug. 31, 2006)" Thermo-Calc Software AB., SE-113 64 Stockholm, Sweden (1995-2006) pp. 1-73.*

G. B. Stringfellow, Chapter 4 "Source Molecules" in "Organometallic Vapor-Phase Epitaxy (Second Edition)," Academic Press (1999) pp. 151-209.*

O'Brien P, Pickett NL, et al (2002). "Developments in CVD Delivery Systems, a Chemist's Perspective on the Chemical and Physical Interactions between Precursors." Chemical Vapor Deposition 8(6), pp. 237-249.*

S. Y. Karpov, "Advances in the Modeling of MOVPE Processes," Journal of Crystal Growth 248 (2003) pp. 1-7.*

Elijah, "Maximizing Epitaxial Deposit Uniformity," IBM Technical Disclosure Bulletin, 14(2):593-594 (1971).

Lee et al., "Vapor phase epitaxy of GaN using $GaCl_3/N_2$ and $NH_3/N_2$," Journal of Crystal Growth, 169: 689-696 (1996).

Red'kin et al., "Chemical Vapor Deposition of GaN from Gallium and Ammonium Chloride," Inorganic Materials, 40(10):1049-1053 (2004).

Varadarajan et al., "On the chloride vapor-phase epitaxy growth of GaN and its characterization," Journal of Crystal Growth, 260: 43-49 (2004).

International Search Report and Written Opinion of the International Searching Authority for application No. PCT/US2007/084826, dated Mar. 31, 2008.

International Search Report and Written Opinion of the International Searching Authority for application No. PCT/US2007/084845, dated May 22, 2008.

International Search Report and Written Opinion of the International Searching Authority for application No. PCT/US2007/070721, dated Feb. 1, 2008.

International Search Report and Written Opinion of the International Searching Authority for application No. PCT/US2010/024374, dated Jun. 29, 2010.

Standard Search Report, European Patent Office, dated Jan. 31, 2007.

U.S. Appl. No. 13/145,290, filed Jul. 19, 2011.
U.S. Appl. No. 12/894,724, filed Sep. 30, 2010.
U.S. Appl. No. 61/526,143, filed Aug. 22, 2011.

(56) References Cited

OTHER PUBLICATIONS

Non-Final Office Action mailed Aug. 9, 2011, U.S. Appl. No. 12/305,394.
Non-Final Office Action mailed Oct. 24, 2011, U.S. Appl. No. 12/305,394.
Non-Final Office Action mailed Oct. 7, 2011, U.S. Appl. No. 12/305,434.
Non-Final Office Action mailed Aug. 4, 2011, U.S. Appl. No. 12/305,495.
Final Office Action mailed Oct. 27, 2011, U.S. Appl. No. 12/305,495.
Non-Final Office Action mailed Oct. 6, 2011, U.S. Appl. No. 12/305,534.
Final Office Action mailed Jan. 31, 2012, U.S. Appl. No. 12/305,534.
Advisory Action mailed Feb. 14, 2012, U.S. Appl. No. 12/305,534.
Non-Final Office Action mailed Sep. 26, 2011, U.S. Appl. No. 12/305,553.
Final Office Action mailed Nov. 22, 2011, U.S. Appl. No. 12/305,553.
Advisory Action mailed Dec. 30, 2011, U.S. Appl. No. 12/305,553.
Non-Final Office Action mailed Oct. 28, 2011, U.S. Appl. No. 12/305,574.
Final Office Action mailed Dec. 8, 2011, U.S. Appl. No. 12/305,574.
International Search Report and Written Opinion of the International Searching Authority mailed Apr. 9, 2008, Appl. No. PCT/US07/84820.
International Search Report and Written Opinion of the International Searching Authority mailed Oct. 31, 2008, Appl. No. PCT/US07/84930.
International Search Report and Written Opinion of the International Searching Authority mailed Oct. 3, 2008, Appl. No. PCT/US07/84839.
International Search Report and Written Opinion of the International Searching Authority mailed Mar. 13, 2008, Appl. No. PCT/US07/84857.
International Search Report and Written Opinion of the International Searching Authority mailed May 7, 2008, Appl. No. PCT/US07/84935.
International Search Report and Written Opinion of the International Searching Authority mailed Aug. 27, 2009, Appl. No. PCT/US2008/085707.
Supplementary European Search Report dated Jun. 17, 2010, Appl. No. EP 07873617.
Supplementary European Search Report dated Jun. 1, 2010, Appl. No. EP 07874518.
Supplementary European Search Report dated Jun. 17, 2010, Appl. No. EP 07845102.
Written Opinion mailed Oct. 19, 2009, Appl. No. SG 200901698-1.
Written Opinion mailed Nov. 12, 2009, Appl. No. SG 200901701-3.
Wen et al., Prospect and Construction of Heat Insulating Materials, University of Science and Technology Bejing, China Academic Journal Electronic Publishing House, English Translation of pertinent parts of Chinese language found in English Translation of Office Action—CN Application No. 201080005892.4.
Japanese Office Action for Japanese Application No. 2014-233896, dated Oct. 6, 2015, 3 pages.
Japanese Office Action for Japanese Application No. 2014-233896 dated Jun. 21, 2016, 7 pages with translation.

\* cited by examiner

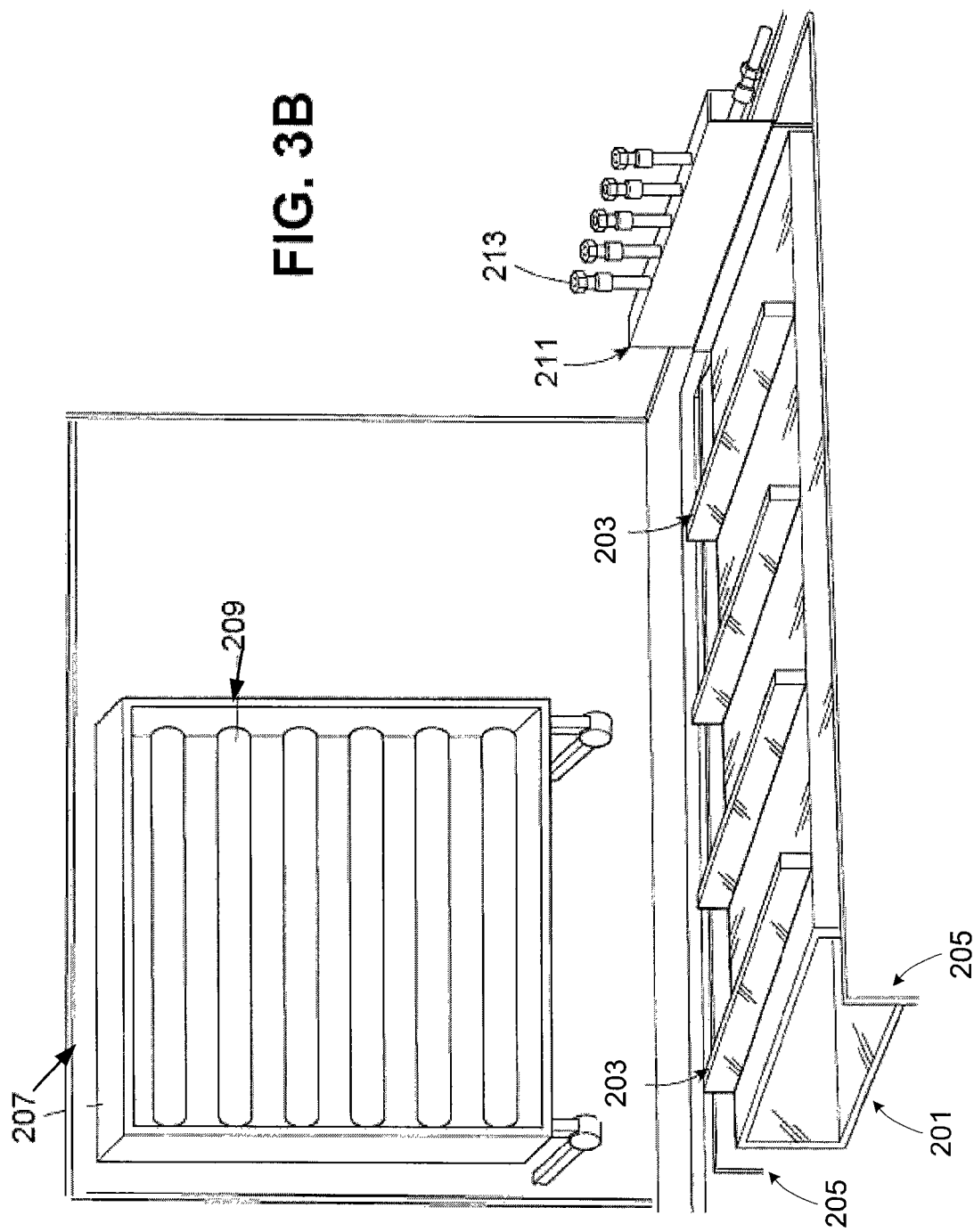

GALLIUM TRICHLORIDE INJECTION SCHEME

CROSS-REFERENCE TO RELATED APPLICATIONS

This application is a divisional of U.S. patent application Ser. No. 13/288,396, filed Nov. 3, 2011, now U.S. Pat. No. 8,323,407, issued Dec. 4, 2012, which is a continuation of U.S. patent application Ser. No. 12/305,534, filed Dec. 18, 2008, now U.S. Pat. No. 8,197,597, issued Jun. 12, 2012, which is a national phase entry under 35 U.S.C. §371 of International Patent Application PCT/US2007/084845, filed Nov. 15, 2007, which claimed priority to U.S. Provisional Patent Application Ser. No. 60/942,832, filed Jun. 8, 2007, and to U.S. Provisional Patent Application Ser. No. 60/866,923, filed Nov. 22, 2006. This application is also related to U.S. patent application Ser. No. 13/828,585, filed Mar. 14, 2013, which is a continuation-in-part of the present application. U.S. patent application Ser. No. 13/828,585 is also a continuation of U.S. patent application Ser. No. 13/145,290, filed Jul. 19, 2011, which application is a national phase entry under 35 U.S.C. §371 of International Patent Application PCT/US2010/024374, filed Feb. 17, 2010, designating the United States of America and published in English as International Patent Publication WO/2010/101715 on Sep. 10, 2010, which claims the benefit under Article 8 of the Patent Cooperation Treaty to U.S. Provisional Patent Application Ser. No. 61/157,112, filed Mar. 3, 2009.

FIELD OF THE INVENTION

The present invention relates to the field of semiconductor processing equipment and methods and provides, in particular, equipment and methods for the high-volume manufacturing of Group III-V compound semiconductor wafers that are suitable for fabrication of optic and electronic components, for use as substrates for epitaxial deposition, and so forth. In preferred embodiments, the equipment and methods are directed to producing Group III nitride semiconductor wafers, and specifically to producing gallium nitride (GaN) wafers.

BACKGROUND OF THE INVENTION

Group III-V compounds are important and widely used semiconductor materials. Group III nitrides, in particular, have wide, direct band gaps, which make them particularly useful for fabricating optic components (particularly, short wavelength LEDs and lasers) and certain electronic components (particularly, high-temperature/high-power transistors).

The Group III nitrides have been known for decades to have particularly advantageous semiconductor properties. However, their commercial use has been substantially hindered by the lack of readily available single-crystal substrates. It is a practical impossibility to grow bulk single-crystal substrates of the Group III nitride compounds using traditional methods, such as Czochralski, vertical gradient freeze, Bridgeman or float zone, that have been used for other semiconductors such as silicon or GaAs. The reason for this is the high binding energy of the Ga—N bond, which results in decomposition, and not melting, of GaN at atmospheric pressure. Very high pressure and temperatures (2500° C. and >4 GPa pressure) are required to achieve melted GaN. While various high-pressure techniques have been investigated, they are extremely complicated and have led to only very small irregular crystals. (A. Denis et al., Mat. Sci. Eng. R50 (2006) 167.)

The lack of a native single-crystal substrate greatly increases the difficulty in making epitaxial Group III nitride layers with low defect densities and desirable electrical and optical properties. A further difficulty has been the inability to make p-type GaN with sufficient conductivity for use in practical devices. Although attempts to produce semiconductor grade GaN began at least in the early 1970s, no usable progress was made until the late 1990s when two breakthroughs were developed. The first was the use of low-temperature GaN and AlN buffer layers, which led to acceptable growth of Group III nitride layers on sapphire. The second was the development of a process to achieve acceptable p-type conductivity. In spite of these technological advances, the defect density in Group III nitride layers is still extremely high (1E9-1E11 cm$^{-3}$ for dislocations) and the p-type conductivity is not as high as in other semiconductors. Despite these limitations, these advances led to commercial production of Group III nitride epitaxial films suitable for LEDs (see, e.g., Nakamura et al., 2nd ed. 2000, *The Blue Laser Diode*, Springer-Verlag, Berlin).

The high defect density is a result of growth on a non-native substrate. Sapphire is the most widely used substrate, followed by silicon carbide. Differences in the lattice constant, thermal coefficient of expansion and crystal structure between the Group III nitride epitaxial layer and the substrate lead to a high density of defects, stress and cracking of the Group III nitride films or the substrate. Furthermore, sapphire has a very high resistivity (cannot be made conductive) and has poor thermal conductivity.

SiC substrates can be produced in both conductive and highly resistive forms, but is much more expensive than sapphire and only available in smaller diameters (typically 50 mm diameter with 150 mm and 200 mm as demonstrations). This is in contrast to sapphire and native substrates for other semiconductors such as GaAs and silicon, which are available at lower cost and in much larger diameters (150 mm diameter for sapphire; 300 mm for GaAs).

While the use of sapphire and SiC are suitable for some device applications, the high defect density associated with Group III nitride layers grown on these substrates leads to short lifetime in laser diodes. Group III nitride laser diodes are of particular interest because their shorter wavelength permits much higher information density in optical recording methods. It is expected that substrates with lower defect densities will lead to higher brightness LEDs, which are required for replacement of incandescent and fluorescent bulbs. Finally, Group III nitride materials have desirable properties for high-frequency, high-power electronic devices, but commercialization of these devices has not occurred, in part because of substrate limitations. The high defect density leads to poor performance and reliability issues in electronic devices. The low conductivity of sapphire makes it unsuitable for use with high-power devices where it is vital to be able to remove heat from the active device region. The small diameter and high cost of SiC substrates are not commercially usable in the electronic device market, where larger device sizes (compared to lasers or LEDs) require lower-cost, large-area substrates.

A large number of methods have been investigated to further reduce the defect density in epitaxial III nitrides on non-native substrates. Unfortunately, the successful methods are also cumbersome and expensive and non-ideal, even if cost is not an object. One common approach is to use a form of epitaxial lateral overgrowth (ELO). In this technique, the substrate is partially masked and the III nitride layer is coerced to grow laterally over the mask. The epitaxial film over the mask has a greatly reduced dislocation density. However, the epitaxial film in the open regions still has the same high dislocation density as achieved on a non-masked substrate. In addition, further defects are generated where adjacent laterally overgrown regions meet. To further reduce the dislocation density, one can perform multiple ELO steps. It is clear that this is a very expensive and time-consuming process and, in the end, produces a non-homogeneous substrate, with some areas of low dislocation density and some areas with high dislocation density.

The most successful approach to date to reducing defect densities is to grow very thick layers of the III nitride material. Because the dislocations are not oriented perfectly parallel with the growth direction, as growth proceeds, some of the dislocations meet and annihilate each other. For this to be effective, one needs to grow layers on the order of 300 to 1000 μm. The advantage of this approach is that the layer is homogeneous across the substrate. The difficulty is finding a growth chemistry and associated equipment that can practically achieve these layer thicknesses. MOVPE or MBE techniques have growth rates on the order of less than 1 to about 5 nm/hour and thus are too slow, even for many of the ELO techniques discussed above, which require several to tens of microns of growth. The only growth technique that has successfully achieved high growth rates is hydride vapor phase epitaxy (HVPE).

In summary, the current state of the art in producing low dislocation Group III nitride material is to use HVPE to produce very thick layers. However, the current HVPE process and equipment technology, while able to achieve high growth rates, has a number of disadvantages. The present invention now overcomes these disadvantages and provides relatively low-cost, high-quality Group III nitride, which leads to new, innovative applications, e.g., in residential and commercial lighting systems.

SUMMARY OF THE INVENTION

The invention relates to a method and system for epitaxial deposition of a monocrystalline Group III-V semiconductor material. The method comprises reacting an amount of a gaseous Group III precursor as one reactant, with an amount of a gaseous Group V component as another reactant, in a reaction chamber under conditions sufficient to provide the semiconductor material, with heating of the gaseous Group III precursor prior to entry into the reaction chamber to a temperature that is sufficiently high to avoid introducing undesirable precursor compounds into the reaction chamber to facilitate manufacture of the semiconductor material.

In addition, the invention relates to a method for epitaxial deposition of a Group III-V semiconductor material comprising gallium, which comprises reacting an amount of a gaseous Group III precursor comprising one or more gaseous gallium precursors as one reactant, with an amount of a gaseous Group V component as another reactant, in a reaction chamber, and supplying sufficient energy to the gaseous gallium precursors prior to their reacting so that substantially all such precursors are in their monomer forms.

Generally, the undesirable precursor compounds include dimers, trimers, or other molecular variations of the precursor that reduce the reaction of the Group III precursor with the Group V component. When the Group III precursor is gaseous gallium trichloride, the method includes heating that precursor to a temperature sufficient to decompose gallium chloride dimers or trimers before the gaseous gallium trichloride enters the reaction chamber. Typically, the gaseous gallium trichloride is heated to at least 700° C. prior to entering the reaction chamber.

For high-volume manufacture, the gaseous Group III precursor may be continuously provided into the reaction zone at a mass flow of at least 50 g Group III element/hour for a time of at least 48 hours. The gaseous Group V component may be a nitrogen-containing component and is provided in a substantially greater amount than that of the gaseous Group III precursor so that a monocrystalline Group III nitride is provided. Also, the nitrogen-containing component may be a nitrogen-containing gas such as ammonia or a nitrogen ion or radical generated by plasma-activation of nitrogen gas.

The reaction chamber typically includes one or more walls and the method further comprises introducing the Group III precursor and Group V component into the reaction chamber in a controlled manner to provide a reaction above one or more substrates to optimize the production of the monocrystalline material thereon. Specifically, the reaction chamber may include a floor, a ceiling, a pair of sidewalls, an open inlet and an open outlet, and the method further comprises introducing the heated Group III precursor through a slot in the floor of the chamber. The precursor is preferably heated in a nozzle subjacent the slot.

The invention also relates to a system for forming a monocrystalline Group III-V semiconductor material, which comprises a source of the gaseous Group III precursor as one reactant, a source of Group V component as another reactant, a reaction chamber that receives the reactants for reaction therewith to form the monocrystalline Group III-V semiconductor material, and a heating device for heating the gaseous Group III precursor prior to entering the reaction chamber to a temperature that is sufficiently high to avoid introducing undesirable precursor compounds into the reaction chamber to facilitate manufacture of the semiconductor material.

The reaction chamber typically includes one or more substrates supported on one or more susceptors therein. Also, the heating device may be one or more heating structures for heating the gaseous Group III precursor to a temperature to decompose substantially all dimers, trimers or other molecular variations of such precursors into their component monomers.

The source of gaseous Group III precursor is sufficiently large to continuously provide the precursor at a mass flow of at least 50 g Group III element/hour for a time of at least 48 hours to facilitate high-volume manufacture of the semiconductor material. In a preferred embodiment, the reaction chamber may be configured as a horizontal, rectangular chamber and the apertures for introducing the reactants are located in different portions of the chamber to avoid reaction until they meet at a predetermined location adjacent and immediately above one or more substrates for deposition of the semiconductor material thereon. The reaction chamber generally includes a floor, a ceiling, a pair of sidewalls, an open inlet, an open outlet, and one reactant entry aperture comprises a horizontal slot in the floor for introducing that reactant into the reaction chamber, with the slot configured and dimensioned to introduce the reactant and to direct it to the predetermined location for reaction with another reactant. The source of gaseous Group III precursor is typically in gas flow association with the slot to introduce the precursor into the reaction zone through the slot.

The system preferably comprises a reactant introduction device that includes a nozzle containing heat transfer materials therein, wherein the device is operatively associated with the heating device to heat the precursor prior to its introduction into the reaction chamber. When the gaseous Group III precursor is gallium trichloride, the heating device heats the gallium trichloride to at least 700° C. to decompose gallium chloride dimers or trimers before the heated gaseous gallium trichloride enters the reaction chamber.

The reaction chamber generally includes a rotatable support for holding the one or more substrates upon which the monocrystalline semiconductor material is to be deposited. The reaction chamber also further comprises an entry aperture for the other reactant, which comprises an injection nozzle that directs the other reactant to the predetermined location to efficiently form the monocrystalline semiconductor material upon the one or more substrates.

Typically, the reaction chamber is made of quartz. Also, the reaction chamber may be surrounded by an enclosure, which is operatively associated with one or more fans for circulating air in the enclosure to lower the temperature of the reaction chamber wall(s) to reduce or prevent deposition of the Group III precursor or reaction byproducts on the reaction chamber wall(s) to provide a longer operating time before maintenance is required.

Further aspects and details and alternative combinations of the elements of this invention will be apparent from the accompanying drawings and following detailed description and these are also within the scope of the invention.

BRIEF DESCRIPTION OF THE DRAWINGS

The present invention may be understood more fully by reference to the following detailed description of the preferred embodiments of the present invention, illustrative examples of specific embodiments of the invention, and the accompanying figures, in which:

FIGS. 3A-3C illustrate preferred reaction chambers.

The same reference numbers are used to identify the same structures appearing on different figures.

DETAILED DESCRIPTION

Figure 1:
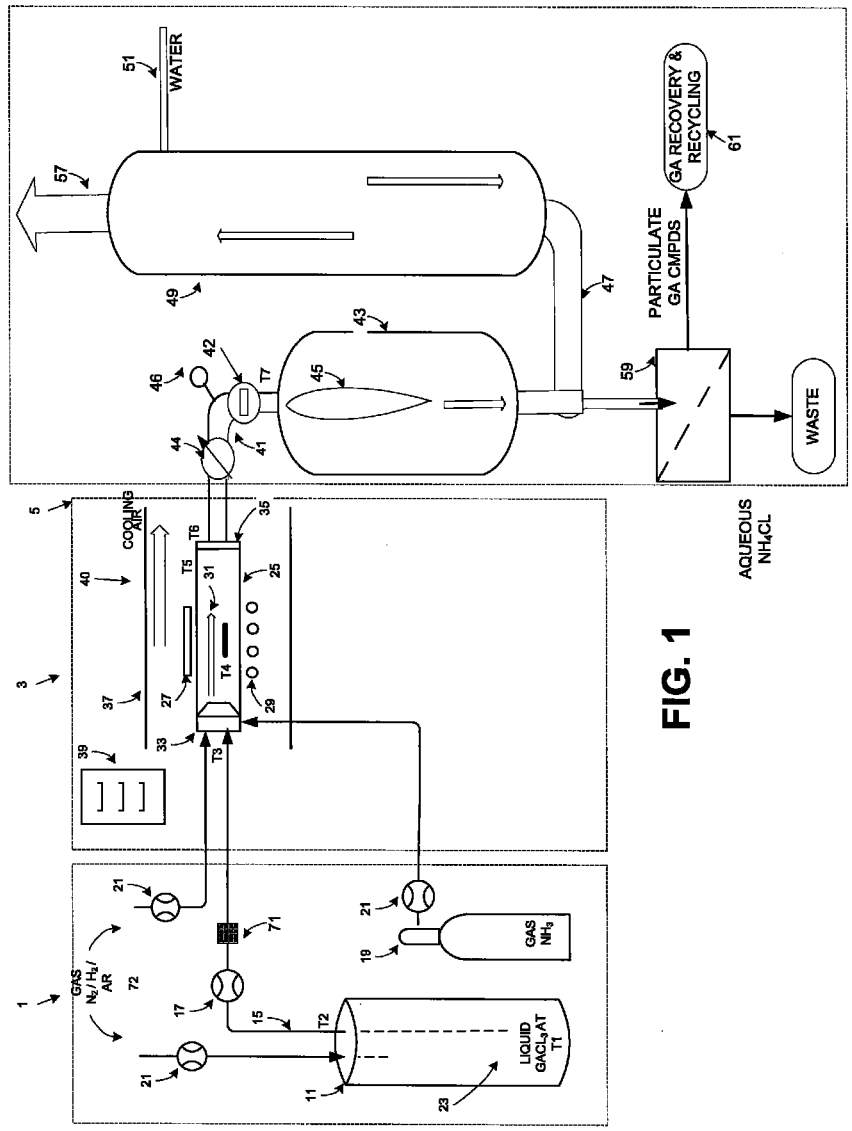
FIG. 1 schematically illustrates systems of the invention.

This invention provides equipment and methods for high growth rate and high-volume manufacturing of Group III-V compound semiconductor wafers not hitherto possible. The equipment is capable of sustained production in that over periods of weeks or months, production does not need to be shut down for maintenance. The equipment is capable of high-throughput production in that at least a wafer (or a batch of wafers) can be produced every one to four hours. The Group III-V compound semiconductor wafers so produced are suitable for fabrication of optical and electronic components, for substrates for further epitaxial deposition and for other semiconductor material applications.

In preferred embodiments, the equipment and methods are specifically directed to producing GaN nitride wafers, and such embodiments are the focus of much of the subsequent description. This focus is for brevity only and should not be taken as limiting the invention. It will be appreciated that the preferred embodiments can readily be adapted to producing wafers of other Group III nitrides, e.g., aluminum nitride, indium nitride, and mixed aluminum/gallium/ indium nitrides, and to producing wafers of Group III phosphides and arsenides. Accordingly, producing semiconductors wafers or wafers of any of the Group III-V compound semiconductors are within the scope of this invention.

This invention can be particularly cost effective because particular embodiments can be realized by modifying equipment already commercially available for epitaxial deposition of Si. Thereby, focus can be on the elements and features that are especially important to GaN epitaxy, while aspects related to high-volume manufacturing, which are well developed in silicon technology, can be maintained. Also, the equipment of this invention is designed to have a significant duty cycle so that it is capable of high-volume manufacturing. Also, the invention provides for virtually 100% efficiency in the use of expensive Ga by recovering and recycling of Ga that is not actually deposited and is, therefore, exhausted from the reaction chamber equipment, with limited downtime needed. Also, the inventive process and apparatus include an economical use of Ga precursors.

The invention includes the use of a known low thermal mass susceptor (substrate holder) and lamp heating with temperature controlled reactor walls. The use of lamp heating permits the heat energy to mainly be coupled to the susceptor and not heat the reactor walls. The lamp heating system is equipped with a control system to permit very fast power changes to the lamps. The low thermal mass susceptor coupled with the lamp heating system permit very fast temperature changes, both up and down. Temperature ramp rates are in the range of 2-10 degrees/second and preferably on the order of 4-7 degrees/second.

The invention includes reactor walls that are controlled to a specific temperature to minimize undesired gas phase reactions and prevent deposition on the walls. The lack of wall deposition permits straightforward use of in situ monitoring for growth rate, stress and other pertinent growth parameters.

The invention includes one or more external sources for the Group III precursor(s). The flow of the Group III precursor is directly controlled by an electronic mass flow controller. There is no practical limit on the size of the external Group III source. Group III source containers can be in the range of 50 to 100 to 300 kg, and several source containers could be manifolded together to permit switching between containers with no down time. For the deposition of GaN, the Ga precursor is $GaCl_3$. This Ga source is based on the observations and discoveries that, when $GaCl_3$ is in a sufficiently low-viscosity state, routine physical means, e.g., bubbling a carrier gas through liquid $GaCl_3$, can provide a sufficient evaporation rate of $GaCl_3$, and that $GaCl_3$ assumes such a sufficiently low-viscosity state in a preferred temperature range of 110° C. to 130° C.

The invention includes equipment for maintaining the $GaCl_3$ at a constant temperature and pressure in the low-viscosity state and equipment for flowing a controlled amount of gas through the liquid $GaCl_3$ and delivering the $GaCl_3$ vapor to the reactor. This equipment can sustain high mass flows of $GaCl_3$ (in the range of 200 to 400 g/hour) that result in GaN deposition rates in the range of 100 to 400 μm/hour on one 200 mm diameter substrate or any number of smaller wafers that fit on the susceptor. The delivery system from the $GaCl_3$ container is maintained with a specific temperature profile to prevent condensation of the $GaCl_3$.

The invention also includes an inlet manifold structure that keeps the Group III and Group V gases separate until the deposition zone and also provides a method for achieving high gas phase homogeneity in the deposition zone, thus achieving a uniform flow of process gases into the reaction chamber and across the susceptor supporting the substrates. The process gas flow is designed to be substantially uniform in both flow velocity (therefore, non-turbulent) and chemical composition (therefore, a uniform III/V ratio). In a preferred embodiment, this is realized by providing separate primary inlet ports for the Group III and Group V gases that provide uniform distribution of gas across the width of the reactor, and to achieve high uniformity. In preferred embodiments, the manifold and port structures are designed and refined by modeling gas flows according to principles of fluid dynamics.

The invention also includes a method to add energy to either or both the Group III or Group V inlets to enhance the reaction efficiency of these precursors. In a preferred embodiment, this would include a method for thermal decomposition of the dimer form of the Group III precursor $Ga_2Cl_6$ into the monomer $GaCl_3$. In another preferred embodiment, this would include a method for decomposition of the ammonia precursor, for example, by thermal decomposition or plasma.

The invention also includes equipment for automated wafer handling, including fully automatic cassette-to-cassette loading, separate cooling stages, load locks, non-contact wafer handlers, all of which are fully computer controlled and interfaced to the overall growth program.

The invention also includes temperature control of the reactor inlet and outlet flanges and the exhaust system and a specially designed pressure-regulating valve that can operate at reduced pressure and high temperatures. Temperature control in these areas prevents premature gas phase reactions and minimizes deposits of GaN, as well as various reaction byproducts. A major reaction byproduct is $NH_4Cl$. The temperature of the entire exhaust downstream of the reactor is controlled to prevent condensation of $NH_4Cl$.

The invention also includes a gas-purged gate valve to reduce deposits on the valve material and the side walls of the reactor and to reduce gas recirculation and reduce residence time of the gases in the reactor.

Additional aspects and details of the invention include the use of a susceptor that can hold one or more wafers during one growth run and a susceptor designed to prevent attachment of the substrate to the susceptor during thick growth runs.

The present invention is based on the discovery that specific metal halide compounds have certain unique chemical properties, and that when coupled with an apparatus designed in light of these properties, the combination can be used to deposit thick layers of Group III-V compound semiconductors and, in particular, gallium nitride, with heretofore unachievable high throughput, high uptime and low cost in a manner characteristic of high-volume manufacturing.

For this invention, "high volume manufacturing" (or HVM) is characterized by high throughput, high precursor efficiency and high equipment utilization. Throughput means the number of wafers/hour that can be processed. Precursor efficiency means that a large fraction of the material input to the system goes into the product and is not wasted. Although there are a large number of variables associated with the material, process and structure, HVM deposition rates range from around 50 g Group III element (such as gallium) per hour for a period of at least 48 hours, to 100 g Group III element per hour for a period of at least 100 hours, to 200 g Group III element per hour for a period of at least one week, to as much as 300 to 400 g Group III element per hour for a period of at least a month. A typical source capacity can range from 5 Kg to 60 Kg in one vessel and, for increased HVM, multiple vessels can be operated in series. This can provide Group III-V material throughputs that are similar to those obtained in silicon manufacture.

Equipment utilization means the ratio of the time that the substrate is in the reactor compared to a given time period, such as 24 hours. For HVM, most of the time is spent producing product as opposed to set-up, calibration, cleaning or maintenance. Quantitative ranges for these measures are available for mature silicon semiconductor processing technology. The equipment utilization for HVM of Group III-V material is on the order of about 75 to 85%, which is similar to that of silicon epitaxial deposition equipment.

Reactor utilization is the period of time during which growth of the material on the substrate is occurring in the reactor. For conventional HVPE reactors, this value is on the order of 40 to 45%, while for a HVM reactor such as those disclosed herein, this value is on the order of 65 to 70%.

Growth utilization is the overhead time in the reactor, meaning that it is the time during which growth is occurring in the reactor after a substrate is provided therein. For conventional HVPE reactors, this value is on the order of 65 to 70%, while for an HVM reactor such as those disclosed herein, this value is on the order of 95% to close to 100%, i.e., close to that of a silicon manufacturing process.

The present invention addresses the main limitations of the current HVPE technology that prevent high-volume manufacturing. This is done by replacing the current HVPE in situ source generation with an external source and replacing the current HVPE high thermal mass hot wall reactor with a low thermal mass reactor with temperature-controlled walls. The use of an external source eliminates the need to stop production to charge the precursors, greatly increasing the equipment utilization. Furthermore, the mass flux of the precursor is controlled directly by an electronic mass flow controller, resulting in improved control of the growth process and improved yield. The low thermal mass reactor with temperature-controlled walls greatly reduces the time required for heating and cooling, both during growth and maintenance. The ability to rapidly heat and cool the substrate also permits the use of multi-temperature processes, which are not practically possible in the current HVPE hot wall system. The ability to control the wall temperature reduces gas phase reactions and almost completely eliminates wall deposits. Elimination of wall deposits greatly increases the time between cleaning, leading to high reactor utilization.

The present invention is based on the fact that certain metal halide compounds can be used as an external source for HVPE deposition of Group III-V compound semiconductors and can provide, in conjunction with specific delivery equipment detailed in this invention, a sufficiently high mass flux to achieve and maintain high deposition rates on large areas. In particular, when melted, $GaCl_3$ is in a sufficiently low-viscosity state to permit routine physical means, e.g., bubbling with a carrier gas through liquid $GaCl_3$, to provide a sufficient evaporation rate of $GaCl_3$ so that $GaCl_3$ assumes a sufficiently low-viscosity state at temperatures of approximately 130° C. Furthermore this invention is based on the fact that $GaCl_3$, in the liquid phase and in the gas phase at temperatures below about 400° C. is actually a dimer. The chemical formula for the dimer can be written either as $(GaCl_3)_2$ or $Ga_2Cl_6$.

In addition to $Ga_2Cl_6$, related chlorogallanes can also be used as a Ga precursor. These compounds are similar to $Ga_2Cl_6$ but with H replacing one or more Cl atoms. For example, monochlorogallane has the two bridge Cl atoms replaced by H atoms. As shown below, the terminal Ga-bonded atoms can also be replaced by H (note that there is a cis and trans version of this compound). According to B. J. Duke et al., *Inorg. Chem.* 30 (1991) 4225, the stability of the dimer decreases with increasing chlorination of the terminal Ga-x bonds by 1-2 kcal/mol per Cl substitution and increases by 6-8 kcal/mol with each Cl substitution for a bridging H atom. Thus, as the number of substituted Cl atoms decreases, the fraction of the monomer, at a given temperature, would decrease.

II.

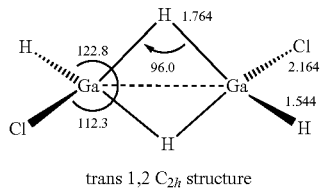

trans 1,2 $C_{2h}$ structure

III.

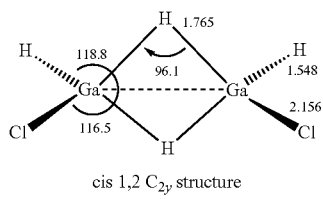

cis 1,2 $C_{2v}$ structure

The growth of In- and Al-containing compounds can be achieved using substantially similar equipment but with the limitation that these sources are not as easily kept in a liquid state. $InCl_3$ melts at 583° C. While the present invention described for $GaCl_3$ may be modified to operate at temperatures above 583° C., this is practically quite difficult. An alternative approach is to heat the $InCl_3$ to a temperature below the melting point but where the vapor pressure is sufficient to achieve acceptable deposition rates.

$AlCl_3$ sublimes at 178° C. and melts at 190° C. and 2.5 atm. The present invention described for $GaCl_3$ can be modified to operate at higher than atmospheric pressure and temperatures above the melting point of $AlCl_3$. Additionally, the alternative approach described above for $InCl_3$, heating below the melting point to achieve a sufficiently high vapor pressure, will also work. $AlCl_3$ also forms a dimer $(AlCl_3)_2$ in the liquid phase and in the gas phase at low temperatures.

Another main component of this invention is a low thermal mass reactor. The low thermal mass reactor with temperature-controlled walls greatly reduces the time required for heating and cooling, both during growth and maintenance. The ability to rapidly heat and cool the substrate also permits the use of multi-temperature processes, which are not practically possible in the current HVPE hot wall system. The ability to control the wall temperature reduces gas phase reactions and almost completely eliminates wall deposits. Elimination of wall deposits greatly increases the time between cleaning, leading to high reactor utilization.

The low thermal mass is achieved by using what is traditionally called a cold wall system, but in this invention, the wall temperature is controlled to a specific temperature. The current hot wall systems are heated by being enclosed in a furnace. In the new system, only the substrate holder and substrate are heated. There are many ways to achieve this including lamp heating, induction heating or resistance heating. In one embodiment, the system consists of a reactor chamber constructed from quartz and a substrate heater constructed of graphite. The graphite is heated by lamps on the outside of the quartz reactor. The quartz reactor walls can be controlled using a variety of methods. In most cases, the wall temperature control system consists of one or more methods to measure the wall temperature in a variety of locations, combined with a feedback system to adjust either cooling or heating input to the wall region to maintain the temperature at a preset value. In another embodiment, the wall temperature is controlled by fans that blow air onto the exterior of the reactor walls for cooling. The wall temperature is not constrained to be constant at all times; the temperature controller can be programmed to vary the temperature to achieve improved performance either during growth or maintenance.

Although the focus of the following description is primarily on preferred embodiments for producing gallium nitride (GaN) wafers, it will be appreciated that the equipment and methods described can be readily adapted by one of average skill in the art to also produce wafers of any of the Group III-V compound semiconductors are within the scope of this invention. Accordingly, such equipment is within the scope of the invention. Headings are used throughout for clarity only and without intended limitation.

The invention also provides equipment for high-volume manufacturing of GaN wafers that is economical to construct and operate. Preferred embodiments of the invention can be economically realized/constructed by adapting/modifying existing VPE equipment that has been designed for and is commercially available for silicon (Si) epitaxy. To practice this invention, it is not necessary to undertake an expensive and time-consuming process of designing and constructing all components for GaN deposition equipment from scratch. Instead, sustained, high-throughput GaN deposition equipment of the invention can be more rapidly and economically realized/constructed by making targeted and limited modifications to existing Si processing production-proven equipment. Along with such modified existing equipment, however, the invention also encompasses de novo construction.

Accordingly, the following description is first directed to the generally preferred features to be incorporated into existing Si equipment for GaN production. Features that can be retained from Si processing are not described in detail as they are well known in the art. In different embodiments, different features to be described can be implemented; the invention is not limited to embodiments implementing all these features. However, for higher levels of sustained, high-throughput production, most or all of these features are advantageous and they include cassette-to-cassette loading, load locks and fully automated wafer handling with a separate cooling stage, which allows fast loading and unloading and processing a wafer while the other one is cooling. The load locks eliminate undesirable exposure of the reactor to atmosphere to minimize introduction of oxygen and water vapor and greatly reduce purge/bake time before running. Moreover, the automated handling reduces yield loss and wafer breakage from manual handling of wafers. In some cases, a Bernoulli wand is used to handle the wafers, which allows hot loading and unloading at temperatures as high as 900° C. and saves from a long cooling time.

General embodiments of the preferred features of this invention are first described in the context of a generic VPE system. It will become apparent how these general embodiments can be routinely adapted to particular, commercially available, Si epitaxy equipment. The following description is then directed to a particular preferred embodiment of this invention and of its preferred features that is based on one of the EPSILON® series of single-wafer epitaxial reactors available from ASM America, Inc. (Phoenix, Ariz.). It is apparent, however, that the invention is not limited to this particular preferred embodiment. As another example, the inventions could easily be adapted to the CENTURA® series of AMAT (Applied Materials, Inc., Santa Clara, Calif.).

Preferred embodiments of the equipment and methods of the invention (for producing GaN wafers) are described in general with reference to FIG. 1. Particularly preferred embodiments are then described in more detailed with reference to FIGS. 2-5. Generally, the equipment of this invention is designed and sized both for high-volume manufacturing of epitaxial GaN layers on substrates and also for economy of construction and operation.

General Embodiments of the Invention

For convenience and without limitation, the invention is generally described with reference to FIG. 1 in terms of three basic subsystems: subsystem 1 for providing process gases (or liquids); subsystem 3 including a reaction chamber; and subsystem 5 for waste abatement.

As noted above, HVM is an attribute of a combination of various physical features of the system including the generic features described herein:

1. External Source of $GaCl_3$

The structure of the first subsystem, the process gas subsystem, especially the gallium compound vapor source, is an important feature of the invention. Known GaN VPE processes are now briefly described. GaN VPE epitaxy comprises synthesizing GaN directly on the surface of a heated substrate from precursor gases containing nitrogen (N) and gallium (Ga) (and, optionally, one or more other Group III metal-containing gases in order to form mixed nitrides and, optionally, one or more dopants to provide specific electronic conductivity). The Ga-containing gas is usually gallium monochloride (GaCl) or gallium trichloride ($GaCl_3$), or a gallium-organic compound, e.g., tri-ethyl-gallium (TEG) or tri-methyl-gallium (TMG). In the first case, the process is referred to as HVPE (Halide Vapor Pressure Epitaxy and in the second as MOVPE (Metal Organic Vapor Pressure Epitaxy).

The chemical properties of GaCl (stability only at high temperatures) require that GaCl vapor be synthesized in situ in the reaction vessel, e.g., by passing HCl over a boat containing liquid Ga. In contrast, $GaCl_3$ is a stable solid at ambient conditions (in the absence of moisture), which is commonly supplied in sealed quartz ampoules, each with about 100 g or so. TMG and TEG are volatile liquids. The N-containing gas is usually ammonia ($NH_3$), and semiconductor quality $NH_3$ is available in standard cylinders.

Alternatively, plasma-activated $N_2$, e.g., containing N ions or radicals, can be used as the N-containing gas. Molecular $N_2$ is substantially unreactive with $GaCl_3$ or GaCl, even at high process temperatures. Nitrogen radicals can be prepared in a manner known in the art, in general, by providing energy to split a nitrogen molecule, for example, by adding an RF source to a nitrogen line to generate an electromagnetically induced plasma. When operating in this mode, the pressure in the reactor is usually reduced.

Of the known VPE processes, MOCVD and GaCl HVPE have been found to be less desirable for sustained, high-volume manufacturing of Group III nitride layers. First, MOCVD is less desirable for the growth of films greater than 10 μm because achievable deposition rates are less than 5% of the deposition rates achievable by HVPE processes. For example, HVPE deposition rates can be in the range of 100-1000 μ/hour or more, while MOCVD rates are typically less than 10 μ/hour. Second, GaCl HVPE is less desirable because this process requires that a supply of liquid Ga be present in the reaction chamber in order to form GaCl by reaction with HCl. It has been found that maintaining such a supply of liquid Ga in a form that remains reactive with HCl and that is sufficient for high-volume manufacturing is difficult.

Therefore, equipment of the invention is primarily directed to $GaCl_3$ HVPE for high-volume manufacturing. Optionally, it can also provide for MOCVD for, e.g., deposition of buffer layers and the like. However, use of $GaCl_3$ HVPE for high-volume manufacturing requires a source of $GaCl_3$ vapor that achieves a sufficient flow rate that can be maintained without interruption (except for wafer loading/unloading in the reaction chamber) for a sufficient period. Preferably, an average sustained deposition rate is in the range of 100 to 1000 μm/hour of GaN per hour so that approximately one wafer (or one batch of multiple wafers) requires no more than one or two hours of deposition time for even thick GaN layers. Achieving such a preferred deposition rate requires that the source provide a mass flow of $GaCl_3$ vapor at about approximately 250 or 300 g/hour (a 200 mm circular, 300 μm thick layer of GaN comprises about approximately 56 g of Ga while $GaCl_3$ is about 40% Ga by weight). Further, such a flow rate can preferably be maintained for a sufficient duration so that production interruptions required to recharge/service the source are limited to at most one per week, or more preferably one at least every two to four weeks. Accordingly, it is preferred that the flow rate can be maintained for at least 50 wafers (or batches of multiple wafers), and preferably for at least 100, or 150, or 200, or 250 to 300 wafers or batches or more. Such a source is not known in the prior art.

The equipment of the invention provides a $GaCl_3$ source that overcomes problems in order to achieve preferred flow rates and durations. Achieving preferred flow rates has been hindered in the past by certain physical properties of $GaCl_3$. First, at ambient conditions, $GaCl_3$ is a solid, and vapor can be formed only by sublimation. However, it has been determined that $GaCl_3$ sublimation rates are inadequate for providing vapor at preferred mass flow rates. Second, $GaCl_3$ melts at about 78° C., and vapor can then be formed by evaporation from the liquid surface. However, it has also been determined that evaporation rates are inadequate for providing preferred mass flow rates. Further, typical physical means for increasing rate of evaporation, e.g., agitation, bubbling, and the like, do not increase evaporation rate sufficiently because $GaCl_3$ liquid is known to be relatively viscous.

What is needed is a form of liquid $GaCl_3$ of sufficiently lower viscosity, and it has been observed and discovered that beginning at about approximately 120° C., and especially at about approximately 130° C. or above, $GaCl_3$ assumes such a lower viscosity state with a viscosity similar to, e.g., that of water. And further, it has been observed and discovered that in this lower viscosity state, routine physical means are capable of effectively raising the $GaCl_3$ evaporation rate sufficiently to provide the preferred mass flow rates.

Accordingly, the $GaCl_3$ source of this invention maintains a reservoir of liquid $GaCl_3$ with temperature T1 controlled to approximately 130° C. and provides physical means for enhancing the evaporation rate. Such physical means can include: agitate the liquid; spray the liquid; flow carrier gas rapidly over the liquid; bubble carrier gas through the liquid; ultrasonically disperse the liquid; and the like. In particular, it has been discovered that bubbling an inert carrier gas, such as He, $N_2$ or $H_2$ or Ar, by arrangements known in the art through a lower viscosity state of liquid $GaCl_3$, e.g., $GaCl_3$ at about 130° C., is capable of providing the preferred mass flow rates of $GaCl_3$. Preferred configurations of the $GaCl_3$ source have increased total surface area in proportion to their volume in order to achieve better temperature control using heating elements outside of the reservoir. For example, the illustrated $GaCl_3$ source is cylindrical with a height that is considerably greater than the diameter. For $GaCl_3$, this would be around 120 g per hour for a period of at least 48 hours, to 250 g per hour for a period of at least 100 hours, to 500 g per hour for a period of at least one week, to as high as 750 to 1000 g per hour for a period of at least a month.

Moreover, a $GaCl_3$ source capable of the preferred flow rate and duration cannot rely on $GaCl_3$ supplied in individual 100 g ampoules. Such an amount would be sufficient for only 15 to 45 minutes of uninterrupted deposition. Therefore, a further aspect of the $GaCl_3$ source of this invention is large $GaCl_3$ capacity. To achieve the high-throughput goals of this invention, the time spent recharging $GaCl_3$ source is preferably limited. However, recharging is made more complicated by the tendency of $GaCl_3$ to react readily with atmospheric moisture. The $GaCl_3$ charge, the source, and the $GaCl_3$ supply lines must be free of moisture prior to wafer production. Depending on the throughput goals of various embodiments, the invention includes sources capable of holding at least about 25 kg of $GaCl_3$, or at least about 35 kg, or at least about 50 to 70 kg (with an upper limit determined by requirements of size and weight in view of the advantages of positioning the source in close proximity to the reaction chamber). In a preferred embodiment, the $GaCl_3$ source can hold between about 50 and 100 kg of $GaCl_3$, preferably between about 60 and 70 kg. It will be realized that there is no real upper limit to the capacity of the $GaCl_3$ source other than the logistics of its construction and use. Furthermore, multiple sources of $GaCl_3$ could be set up through a manifold to permit switching from one source to another with no reactor downtime. The empty source could then be removed while the reactor is operating and replaced with a new full source.

A further aspect of the $GaCl_3$ source of this invention is careful temperature control of the supply lines between the source and the reaction chamber. The temperature of the $GaCl_3$ supply lines and associated mass flow sensors, controllers, and the like preferably increase gradually from T2 at the exit from the source up to T3 at reaction chamber inlet 33 in order to prevent condensation of the $GaCl_3$ vapor in the supply lines and the like. However, temperatures at the reaction chamber entry must not be so high that they might damage sealing materials (and other materials) used in the supply lines and chamber inlet, e.g., to seal to the quartz reaction chamber, for gaskets, O-rings, and the like. Currently, sealing materials resistant to Cl exposure and available for routine commercial use in the semiconductor industry generally cannot withstand temperatures greater than about 160° C. Therefore, the invention includes sensing the temperature of the $GaCl_3$ supply lines and then heating or cooling the lines as necessary (generally, "controlling" the supply line temperatures) so that the supply line temperatures increase (or at least do not decrease) along the supply line from the source, which is preferably at approximately 130° C., up to a maximum at the reaction chamber inlet, which is preferably about 145° C. to 155° C. (or other temperature that is safely below the high temperature tolerance of O-rings or other sealing materials). To better realize the necessary temperature control, the length of the supply line between the source apparatus and the reaction chamber inlet 33 should be short, preferably less than approximately 1 foot, 2 feet, or 3 feet. The pressure over the $GaCl_3$ source is controlled by a pressure control system 17.

A further aspect of the $GaCl_3$ source of this invention is precise control of the $GaCl_3$ flux into the chamber. In a bubbler embodiment, the $GaCl_3$ flux from the source is dependent on the temperature of the $GaCl_3$, the pressure over the $GaCl_3$ and the flow of gas that is bubbled through the $GaCl_3$. While the mass flux of $GaCl_3$ can, in principle, be controlled by any of these parameters, a preferred embodiment is to control the mass flux by varying the flow of a carrier gas by controller 21. Routinely available gas composition sensors, such as a PIEZOCON® and the like, can be used to provide additional control of the actual $GaCl_3$ mass flux, e.g., in grams per second, into the reaction chamber. In addition, the pressure over the $GaCl_3$ source can be controlled by a pressure control system 17 placed on the outlet of the bubbler. The pressure control system 17, e.g., a back pressure regulator, allows for control of the overpressure in the source container. Control of the container pressure in conjunction with the controlled temperature of the bubbler and the flow rate of the carrier gas facilitates an improved determination of precursor flow rate. Optionally, the container also includes an insulating outer portion.

It is desirable that the materials used in the $GaCl_3$ source, in the $GaCl_3$ supply lines, and in the inlet manifold structures in contact with $GaCl_3$ are chlorine resistant. For metal components, a nickel-based alloy such as HASTELLOY®, or tantalum, or a tantalum-based alloy is preferred. Further corrosion resistance for metal components can be provided through a protective corrosion-resistant coating. Such coatings can comprise silicon carbide, boron nitride, boron carbide, aluminum nitride and, in a preferred embodiment, the metal components can be coated with a fused silica layer or a bonded amorphous silicon layer, for example, SILTEK® and SILCOSTEEL® (commercially available from Restek Corporation) has been demonstrated to provide increased corrosion resistance against oxidizing environments. For non-metal components, chlorine-resistant polymeric materials (either carbon or silicone polymers) are preferred.

In view of the above, a preferred $GaCl_3$ source capable of holding preferred amounts of $GaCl_3$ is referred to herein as acting "continuously" in that, in an appropriate embodiment, the source can deliver its contained $GaCl_3$ without interruption to deliver the desired amounts for the recited time durations. It should be understood, however, that, in a particular embodiment, the reaction chamber (or other component of the present system) is or can be so constructed or certain process details are performed, so that intermittent chamber maintenance, e.g., cleaning and so forth, is required. In contrast, the $GaCl_3$ source is configured and dimensioned to provide the desired amounts of the precursor in an uninterrupted manner to facilitate high-volume manufacture of the Group III-V product. Thus, the source is capable of providing these amounts without having to be shut down or otherwise discontinued for replenishment of the solid precursor.

This can be achieved, either by providing sufficiently large quantities of the solid precursor in a single reservoir, or by providing multiple reservoirs that are manifolded together. Of course, a skilled artisan would understand that in a manifolded system, one reservoir can be operated to provide the gaseous precursor while one or more other reservoirs are being replenished with solid precursor material, and that this remains an uninterrupted system since it has no effect on the operation of the reactor. In such embodiments, the $GaCl_3$ source is also referred to herein as acting continuously in that the source can deliver its contained $GaCl_3$ without refilling, opening, cleaning, replenishing or other procedure during which the source is not fully functional. In other words, the source does not by itself necessitate interruption of GaN deposition.

Also, as described, a preferred $GaCl_3$ source can contain $GaCl_3$ in a single reservoir. Also, a preferred source can include multiple reservoirs (i.e., 2, 5, 10, etc.) having outlets that are manifolded so that $GaCl_3$ vapor can be delivered from the multiple reservoirs in sequence or in parallel. In the following, both embodiments are often referred to as a single source. In preferred embodiments, the equipment of this invention can also provide for sources for Group III metal organic compounds so that MOCVD processes can be performed. For example, MOCVD can be used to, e.g., deposit thin GaN or AlN buffer layers, thin intermediate layers, layers of mixed metal nitrides, and so forth. Additional process gases can be routinely supplied as known in the art.

The group V precursor is a gas containing one or more Group V atoms. Examples of such gases include $NH_3$, $AsH_3$ and $PH_3$. For the growth of GaN, $NH_3$ is typically used because it can provide sufficient incorporation of N at typical growth temperatures. Ammonia and other N precursors are external sources. For example, semiconductor grade $NH_3$ is readily available in cylinders 19 of various sizes, and carrier gases 72 are available as cryogenic liquids or as gases, also in containers of various sizes. Fluxes of these gases can be routinely controlled by mass flow controllers 21 and the like. In alternative embodiments, the equipment of this invention can also provide for sources of other Group III chlorides.

2. Reactor Geometry

Next, to achieve increased economy, the reactor subsystems are preferably adaptations of commercially available reactor systems. Available reactors preferred for adaptation and use in this invention include, as-is, most or all of the features to be next described. These features have been determined to be useful for HVM of GaN layers with the modifications and enhancements disclosed herein. Although the following description is directed mainly to embodiments that adapt existing equipment, reactors and reactor systems can be purposely built to include the to-be-described features. The invention includes both redesigning and modifying existing equipment and designing and fabricating new equipment. The invention also includes the resulting equipment.

Generally, preferred reaction chambers have horizontal process-gas flow and are shaped in an approximately box-like or hemisphere-like configuration with lesser vertical dimensions and greater horizontal dimensions. Certain features of horizontal reaction chambers are important in limiting unproductive reactor time and achieving HVM of quality GaN wafers.

3. Low Thermal Mass Susceptor and Lamp Heating

First, time spent ramping-up temperature after introducing new wafers and time spent ramping-down temperature after a deposition run is not productive and should be limited or minimized. Therefore, preferred reactors and heating equipment also have lower thermal masses (i.e., ability to absorb heat quickly), and the lower the thermal masses, the more preferred. Such a preferred reactor is heated with infrared (IR) heating lamps and has IR-transparent walls.

FIG. 1 illustrates reactor 25 made of quartz and heated by lower longitudinal IR lamps 27 and upper transverse IR lamps 29. Quartz is a preferred chamber wall material, since it is sufficiently IR-transparent, sufficiently Cl-resistant, and sufficiently refractory.

4. Closed-Loop Temperature Control on Chamber Walls and Flanges

Time spent cleaning reaction chamber interiors is also not productive and also should be limited or minimized. During GaN deposition processes, precursors, products, or byproducts can deposit or condense on interior walls. Such deposition or condensation can be significantly limited or abated by controlling the temperature of the chamber walls, generally by cooling them to an intermediate temperature that is sufficiently high to prevent condensation of precursors and byproducts, but that is sufficiently low to prevent GaN formation and deposition on the walls. Precursors used in $GaCl_3$ HVPE processes condense at below about 70° C. to 80° C.; the principal byproduct, $NH_4Cl$, condenses only below about 140° C.; and GaN begins to form and deposit at temperatures exceeding about 500° C. Chamber walls are controlled to temperature T5 that is preferably between 200° C., which has been found to be sufficiently high to significantly limit precursor and byproduct condensation, and 500° C., which has been found to be sufficiently low to significantly limit GaN deposition.

Temperature control to preferred ranges generally requires cooling chamber walls. Although IR-transparent, chamber walls are, nevertheless, heated to some degree by heat transferred from the high temperature susceptor. FIG. 1 illustrates a preferred cooling arrangement in which reaction chamber 25 is housed in a full or partial shroud 37 and cooling air is directed through the shroud 37 and over and around the exterior of the reaction chamber 25. Wall temperatures can be measured by infrared pyrometry and cooling air flow can be adjusted accordingly. For example, a multi-speed or a variable speed fan (or fans) can be provided and controlled by sensors sensitive to chamber wall temperatures.

5. Load Lock, Cassette-to-Cassette

Wafer loading and unloading time is also not productive. This time can be routinely limited by automatic equipment schematically illustrated at 39. As is known in the art, this equipment can store wafers, load wafers into, and unload wafers from the reaction chamber, and generally comprises, e.g., robotic arms and the like that move wafers, e.g., using transfer wands, between external holders and the susceptor in the reaction chamber. During wafer transfer, the reaction chamber can be isolated from ambient exposure by intermediate wafer transfer chambers. For example, controllable doors between the transfer chamber and the exterior can permit loading and unloading and can then seal the transfer chamber for ambient exposure. After flushing and preparation, further controllable doors between the transfer chamber and the reactor can open to permit placement and removal of wafers on the susceptor. Such a system also prevents exposure of the reactor interior to oxygen, moisture or other atmospheric contaminants and reduces purging times prior to load and unload of wafers. It is preferred to use a quartz Bernoulli transfer wand because it reduces unproductive time by allowing handling of hot wafers without causing contamination.

6. Separate Injection

Process gas flow control, from inlet manifold 33 in the direction of arrow 31 to outlet manifold 35, is important for depositing high quality GaN layers. This flow includes the following preferred characteristics for the process gases.

First, the gallium-containing gas, e.g., $GaCl_3$, and the nitrogen-containing gas, e.g., $NH_3$, preferably enter the reaction chamber through separate inlets. They should not be mixed outside the reaction chamber because such mixing can lead to undesirable reactions, e.g., forming complexes of $GaCl_3$ and $NH_3$ molecules, that interfere with subsequent GaN deposition.

Then, after separate entry, the $GaCl_3$ and $NH_3$ flows are preferably arranged so that the gas has a uniform composition in space and time over the susceptor. It has been found that the III/V ratio should vary over the face of the susceptor (and supported wafer or wafers) at any particular time, preferably by less than approximately 5%, or more preferably by less than approximately 3% or 2% or 1%. Also, the III/V ratio should be similarly substantially uniform in time over all portions of the face of the susceptor. Accordingly, the $GaCl_3$ and $NH_3$ velocity profiles should provide that both gases both spread laterally across the width of the reaction chamber so that upon arriving at the susceptor, both gases have a non-turbulent flow that is uniform across the width of the reaction chamber and preferably at least across the diameter of the susceptor.

Finally, the flow should not have recirculation zones or regions of anomalously low flow rates, where one or more of the process gases can accumulate with an anomalously high concentration. Localized regions of low gas flow, or even of gas stagnation, are best avoided.

Preferred process gas flow is achieved by careful design or redesign of the inlet manifold of a new or existing reaction chamber. As used herein, the term "inlet manifold" refers to the structures that admit process and carrier gases into a reaction chamber, whether these structures are unitary or whether they comprise two or more physically separate units.

Inlet manifolds designed and fabricated to have the following general features have been found to achieve preferred process gas flows. However, for most embodiments, it is advantageous for the gas flow into a selected reaction chamber produced by a proposed inlet manifold design to be modeled using fluid dynamic modeling software packages known in the art. The proposed design can thereby be iteratively improved to achieve increased uniformity prior to actual fabrication.

First, it has been found advantageous that process gas entry into the reaction chamber be distributed across some, most or all of the width of the chamber. For example, multiple gas inlet ports or one or more slots through which gas can enter can be distributed laterally across the width of the chamber. A carrier gas such as nitrogen or hydrogen can be introduced to assist in directing the $GaCl_3$ and the $NH_3$ gases through the reactor to the desired reaction location above the susceptor. Further, to prevent spurious deposition in the vicinity of the inlet ports, it is advantageous for the actual inlet ports to be spaced with respect to the heated susceptor so that they are not heated above approximately 400° C. to 500° C. Alternatively, the inlet ports can be cooled or can be spaced apart so the process gases do not mix in their vicinity.

Next, it has been found that gas flow properties produced by a particular configuration of the $GaCl_3$ and $NH_3$ inlets can be improved, or "tuned" dynamically. Secondary purge gas flows impinging on or originating, for example, from under the susceptor and mixing with the primary $GaCl_3$, and $NH_3$ flows can be used to alter these flows to increase uniformity of composition and velocity or prevent deposition on reactor components. For example, in embodiments where the $GaCl_3$ and $NH_3$ flows enter the reaction chamber from different inlets, it has been found advantageous to provide a purge gas flow entering into the reaction chamber somewhat upstream of $GaCl_3$ and $NH_3$ flows to confine the process gases above the intended deposition zone and to shield the side walls of the reactor from unintended deposition. For these purposes, it is advantageous to introduce a greater amount of carrier gas laterally near the chamber walls and a lesser amount centrally about the middle of the chamber.

Also, preferred inlet manifolds provide for dynamic adjustment of, at least, one of the process gas flows so that non-uniformities observed during operation can be ameliorated. For example, inlets for a process gas can be divided into two or more streams and individual flow control valves can be provided to independently adjust the flow of each stream. In a preferred embodiment, $GaCl_3$ inlets are arranged into five streams with independently controllable relative flow.

Further aspects of a preferred inlet manifold include temperature control. Thereby, inlet manifold temperatures T3 can be controlled, both to prevent the condensation of precursors, e.g., $GaCl_3$, and to prevent damage to temperature-sensitive materials, e.g., gasket or O-ring materials. As discussed, the $GaCl_3$ inlet ports should be at a temperature no less than the highest temperatures reached in the $GaCl_3$ supply line, which is preferably increased from approximately 130° C. to approximately 150° C. Commercially available chlorine-resistant sealing materials, such as gasket materials and O-ring materials, available for use in the inlet manifold, in particular, for sealing the manifold to the quartz reaction chamber, begin to deteriorate at temperatures in excess of about 160° C. Chlorine-resistant sealing materials, such as silicone O-rings usable to higher temperatures, if available, can also be used, in which case, the inlet manifold upper temperature limit can be raised.

Accordingly, inlet manifold temperature T3 should be controlled to remain in the range of about 155° C. to 160° C. by either supplying heat to raise the temperature from ambient or removing transferred heat from the hot reaction chamber and very hot susceptor. In preferred embodiments, an inlet manifold includes temperature sensors and channels for temperature control fluids. For example, temperatures of 155° C. to 160° C. can be achieved by circulating a temperature-controlled GALDEN™ fluid. Other known fluids can be used for other temperature ranges. The fluid channels preferably run in proximity to the temperature-sensitive portions of the inlet manifold, e.g., the $GaCl_3$ inlet ports and sealing O-rings. Channel arrangement can be chosen more precisely in view of thermal modeling using software packages known in the art.

$GaCl_3$ molecules, whether in the solid or liquid or vapor phase, are known to exist mainly in the $Ga_2Cl_6$ dimer foul'. That form is actually very stable up to 800° C. Thermodynamic calculations corroborated by gas phase Raman spectroscopy have confirmed that at 300° C., more than 90% of the gas phase is composed of the dimer molecule and at 700° C., more than 99% of the dimer has decomposed into the $GaCl_3$ monomer.

As the dimer molecule is injected through a metallic injection port kept at temperatures at or below 150° C., the decomposition of the dimer will occur only in contact with the hot susceptor, which is at a temperature above 1000° C. Depending on the velocity of the gas above the susceptor or its residence time, the portion of the dimer that will be decomposed might be too small to sustain a high growth rate on the wafer. The GaN deposition process proceeds through the adsorption of $GaCl_3$ and its further decomposition to $GaCl_x$ with x<3 until all chlorine has been removed to obtain an adsorbed atom of Ga. It is, therefore, desired to operate from the monomer form of $GaCl_3$. A preferred embodiment of the invention introduces the dimer through a quartz tube under the reactor chamber situated upstream of the susceptor region. This quartz tube connects to the reactor chamber through a funnel with an oval cross-section. Energy is provided to the dimer while in the funnel to decompose the dimer to the monomer. A preferred embodiment uses IR radiation from IR lamps located and shaped in such a way that the quartz tube and funnel receive a high flux of IR radiation. In this embodiment, the funnel region is filled with IR-absorbent materials and the radiation power adjusted to bring the IR-absorbent material to a temperature of 600° C. or more, preferably 700° C. or higher. As the dimer form of $GaCl_3$ is injected in the quartz injector and passes through the hot funnel zone, the dimer will be decomposed to the monomer and be injected in the reaction chamber just upstream of the susceptor. Preferably, the region between the injection point of the $GaCl_3$ into the reactor and the susceptor is maintained at a temperature above 800° C. to prevent the re-formation of the dimer. A preferred embodiment is to use a SiC plate between the funnel and the susceptor, which is heated by the IR heating lamps to maintain a temperature above 700° C., preferably above 800° C.

7. Susceptor and Multi-Wafer Susceptor

The susceptor and its mounting can be of standard construction as generally known in the art. For example, it can comprise graphite coated with silicon carbide or silicon nitride, or alternatively, a refractory metal or alloy. The susceptor is preferably mounted for rotation on a shaft. During GaN deposition, susceptor temperatures $T4$ can be approximately 1000° C. to 1100° C. (or higher) and are maintained by the quartz IR lamps controlled by known temperature control circuitry. To avoid forming a dead zone beneath the susceptor, the susceptor mounting preferably provides for injection of purge gas. This injection is also advantageous because it can limit or minimize unwanted deposition on the underside of the heated susceptor and of adjacent components that may also be heated (directly or indirectly). The susceptor can be configured to hold one or more substrates.

8. Heated Exhaust

Reaction chamber outlet manifold 35 provides for the free and unobstructed flow of exhaust gases from the reaction chamber 25 through the exhaust lines 41 and to waste abatement system 5. The exhaust system can also include a pump (42) and associated pressure control system (pressure control valve (44), pressure gauge (46) and associated control equipment to permit operation at reduced pressure). The outlet manifold exhaust lines and pressure control equipment (if used) are advantageously also temperature controlled to limit condensation of reaction products. Exhaust gases and reaction products typically comprise the carrier gases; un-reacted process gases, $GaCl_3$ and $NH_3$; reaction byproducts, which are primarily $NH_4Cl$, $NH_4GaCl_4$, HCl, and $H_2$. As described above, temperatures above about 130° C. are required to prevent condensation of $GaCl_3$. $NH_4Cl$ condenses into a powdery material below about 140° C., and the outlet manifold 35 and exhaust system should be kept above this temperature. On the other hand, to prevent deterioration of sealing materials, the outlet manifold temperature should not exceed about 160° C.

Accordingly, outlet manifold temperature $T6$ is preferably maintained in the range of approximately 155° C. to 160° C. by temperature control means similar to those used for inlet manifold temperature control (including optional thermal modeling). Maximum exhaust line temperature $T7$ is limited by the maximum allowable temperature for the seals, preferably in the range of about 155° C. to 160° C.

9. Waste Management

Considering next waste abatement subsystem 5, a preferred abatement system can assist in economical operation of the invention by recovery of waste gallium compounds exhausted from the reaction chamber 25. A single embodiment of the invention can exhaust 30 kg, or 60 kg, or more (assuming approximately 50% waste) during a month of sustained, high-volume manufacturing. At current Ga prices, it is economical to recover this waste Ga and recycle it into $GaCl_3$ precursor, thereby effectively achieving approximately 90 to 100% Ga efficiency.

FIG. 1 also schematically illustrates a preferred embodiment of waste abatement subsystem 5 that provides for gallium recovery and that can be readily adapted from commercially available products. The stream exhausted from reaction chamber 25 passes through exhaust lines 41 temperature controlled at $T7$ to limit condensation of exhaust products, e.g., in the range of about 155° C. to 160° C. or greater as convenient, and then into burner unit 43. The burner unit 43 oxidizes the exhaust gases by passing it through high-temperature combustion zone 45 comprising, e.g., $H_2/O_2$ combustion. The oxidized exhaust stream then passes through tube 47 into countercurrent water scrubber unit 49, where it moves in a countercurrent fashion with respect to water stream 51. The water stream 51 removes substantially all water-soluble and particulate components from the oxidized exhaust stream. The scrubbed exhaust gas is then released from the system 57.

The water stream with the soluble and particulate materials passes to separator 59 where particulate components, primarily particulate gallium oxides (e.g., $Ga_2O_3$), are separated 61 from the water-soluble components, primarily dissolved $NH_4Cl$ and HCl. Separation can be obtained by known techniques, such as screening, filtering, centrifugation, flocculation, and so forth. A single embodiment of the invention can produce 60 kg, or up to 120 kg, or more, of particulate $Ga_2O_3$ during each month of operation. The particulate gallium oxide gallates are collected and the Ga is advantageously recovered and recycled into, e.g., $GaCl_3$ by known chemical techniques: see, e.g., Barman, 2003, Gallium Trichloride, SYNLETT 2003, no. 15, pp. 2440-2441. The water-soluble components are passed from the system.

A Preferred Particular Embodiment of the Invention

Next described is a particular preferred embodiment of the invention that has been generally described above. This embodiment is based on the modification and adaptation of an EPSILON® series, single-wafer epitaxial reactor from ASM America, Inc. Accordingly, many of the following features are specific to this preferred particular embodiment. However, these features are not limiting. Other particular embodiments can be based on modification and adaptation of other available epitaxial reactors and are within the scope of the invention.

Figure 2B:
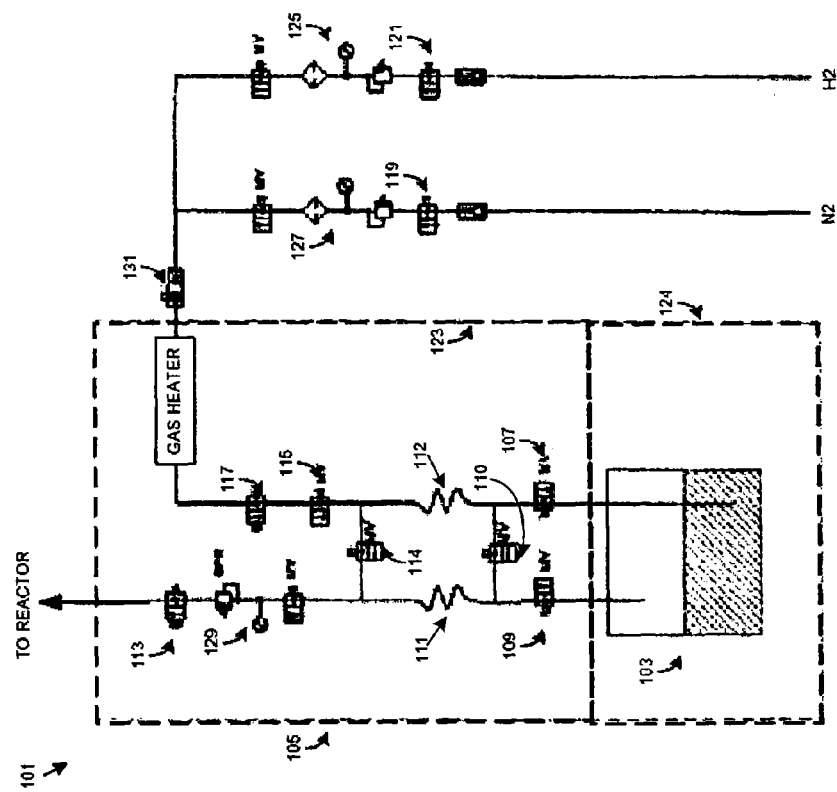
FIGS. 2A-2C illustrate preferred $GaCl_3$ sources.
Figure 2A:
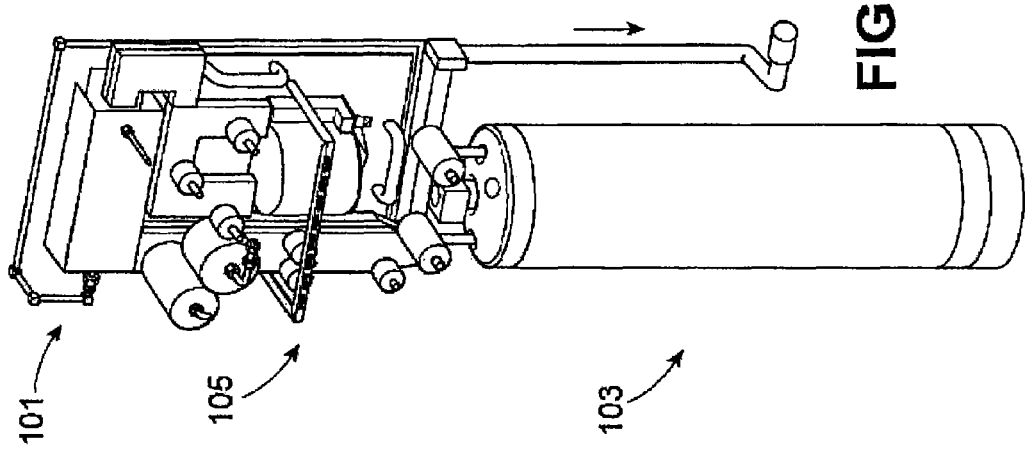
Figure 2C:
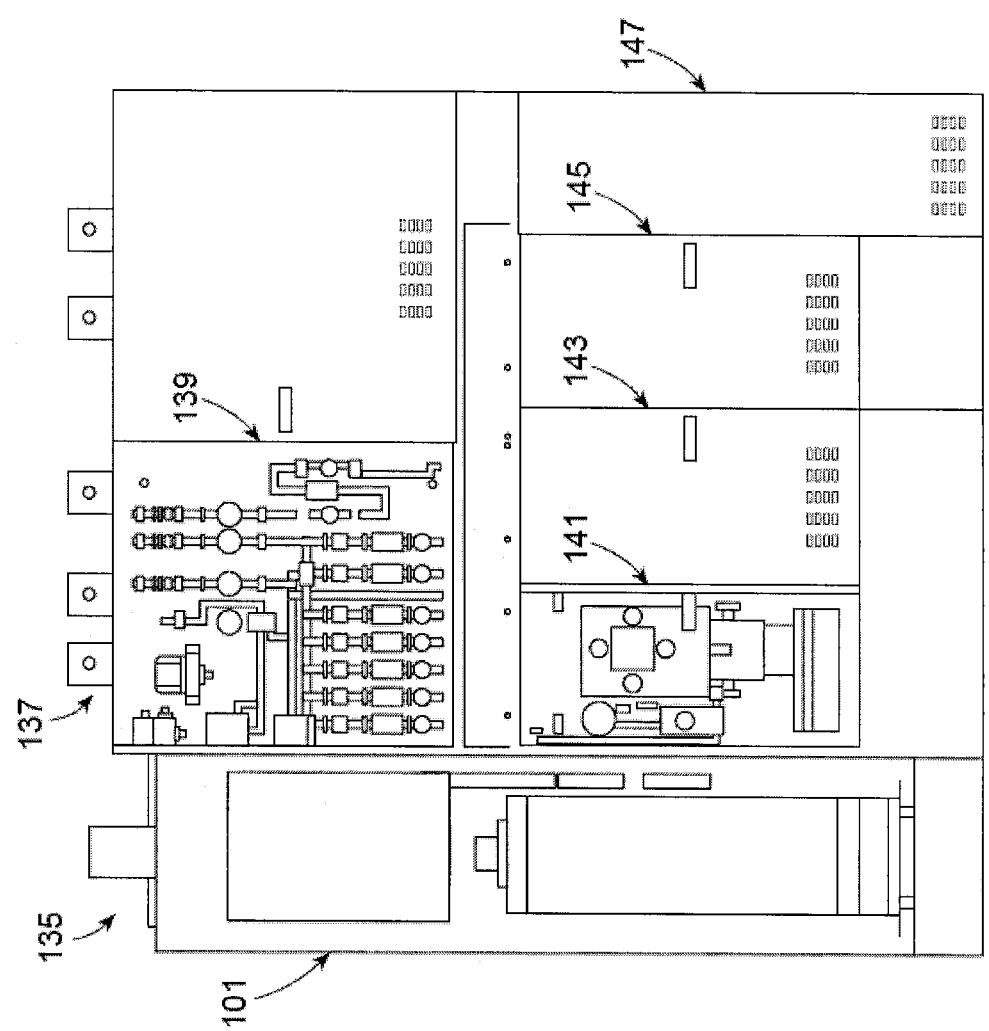

FIGS. 2A-2C illustrate aspects of $GaCl_3$ delivery system 101 including reservoir 103, which can hold 50 to 75 kg of $GaCl_3$ and can maintain it at as a liquid at a controlled temperature of up to about 130° C. to 150° C., and supply assembly with supply lines, valves and controls 105, which provide a controlled mass flow of $GaCl_3$ to the reactor chamber while limiting or preventing $GaCl_3$ condensation within the lines. The reservoir 103 includes internal means for enhancing evaporation of the liquid $GaCl_3$. In a preferred embodiment, these include a bubbler apparatus as known in the art. In alternative embodiments, these can include means for physical agitation of the GaCl₃ liquid, for spraying the liquid, for ultrasonic dispersal of the liquid, and so forth. Optionally, the supply line (or delivery line) includes a coaxial portion having an inner line conveying the carrier gas and the Group III precursor and an enclosing coaxial line providing an annular space inside the enclosing line but outside the inner line. The annular space can contain a heating medium.

FIG. 2C illustrates an exemplary arrangement of delivery system 101 in a cabinet 135, which is positioned adjacent to conventional process gas control cabinet 137. To limit the length of the GaCl₃ supply line, cabinet 135 is also positioned adjacent to the reaction chamber 25, which here is hidden by cabinet 137. Process gas control cabinet 137 includes, for example, gas control panel 139 and separate portions 141-147 for additional process gases or liquids, such as a Group III metal organic compound.

FIG. 2B illustrates preferred supply assembly 105 in more detail. Valves 107 and 109 control lines that conduct carrier gas into reservoir 103, then through the internal bubbler in the reservoir 103, and then out from the reservoir along with evaporated GaCl₃ vapor. They can isolate the reservoir 103 for maintenance and so forth. Valve 110 facilitates the purging of the system above the outlet and inlet valves of the container system. In particular, since condensation can possibly occur in pigtail elements 111, 112, valve 110 is useful in order to purge these areas. Control of the container pressure in conjunction with the controlled temperature of the bubbler and the flow rate of the carrier gas facilitates improved determination of precursor flow rate. The addition of valve 110 allows the complete delivery system 101 to be purged with non-corrosive carrier gas when not in growth mode, thereby reducing exposure of the system to a corrosive environment and consequently improving equipment lifetime. The assembly also includes valves 111-121 for controlling various aspects of flow through the supply lines. It also includes pressure controller and transducer 129 to maintain a constant pressure over the GaCl₃ container. Also provided is a mass flow controller 131 to provide a precise flow of carrier gas to the GaCl₃ container. These act to provide a controlled and calibrated mass flow of GaCl₃ into the reaction chamber. The delivery system 101 also includes pressure regulators 125 and 127. The supply line assembly, including the supply lines, valves, and controllers, is enclosed in multiple aluminum heating blocks in clamshell form to enclose each component. The aluminum blocks also contain temperature sensors that control supply line component temperatures so that the temperature increases (or at least does not decrease) from the output of the reservoir 103 up to the inlet of the reaction chamber 25. A gas heater is provided to heat the inlet gas to the GaCl₃ source, preferably to a temperature of at least 110° C.

Optionally, a purifier capable of removing moisture from the carrier gas down to no more than 5 parts per billion is placed in a carrier gas inlet line. In addition, a carrier gas filter is downstream of the carrier gas purifier. The carrier gas can be optionally configured with sinusoidal bends, e.g., pigtail 112, for providing increased heat exchange surface proximate to the carrier gas heater.

Figure 3A:
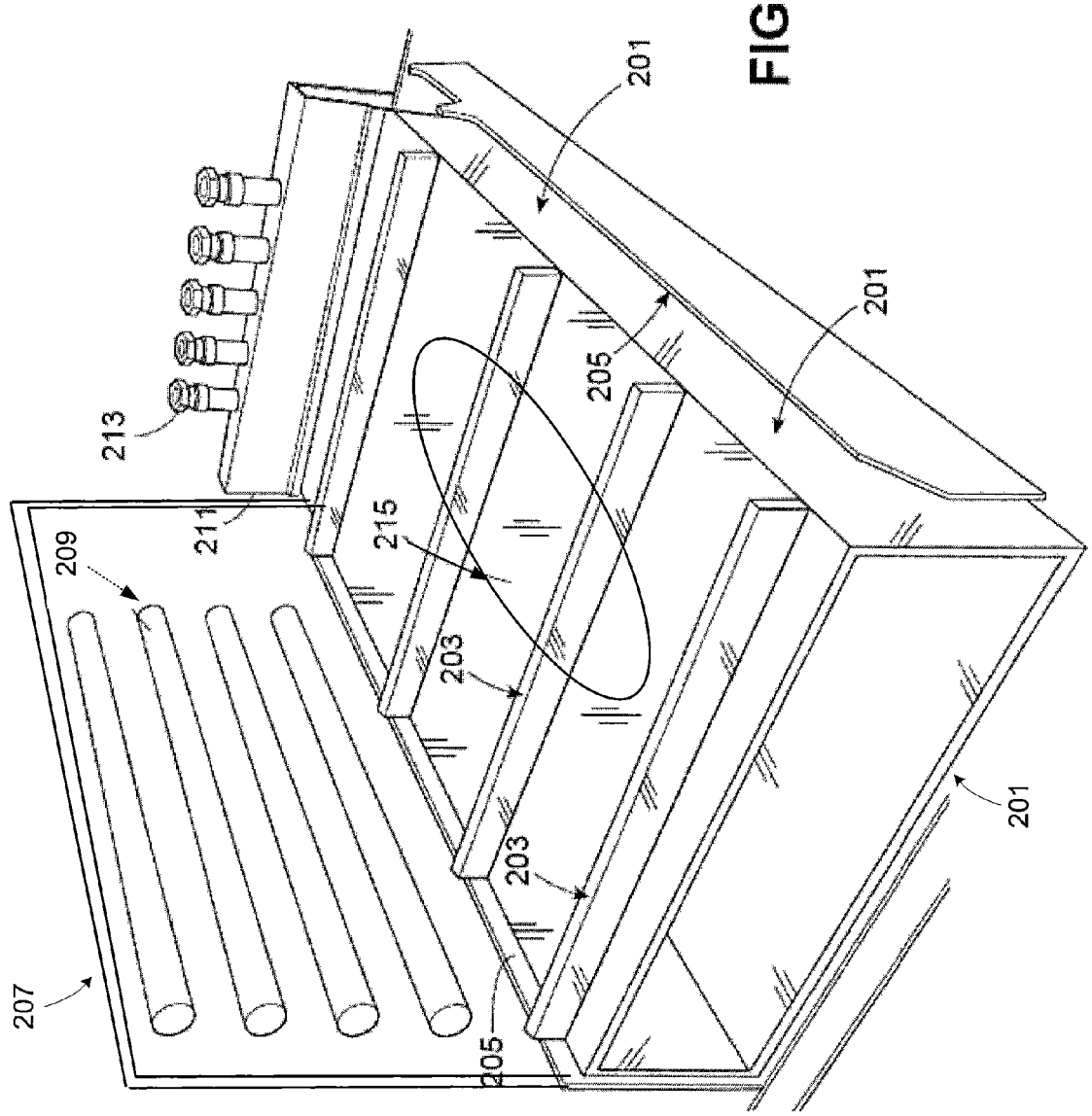

FIGS. 3A and 3B illustrate top views of a preferred embodiment of the reaction chamber 201. This reaction chamber has quartz walls and is generally shaped as an elongated rectangular box structure with a greater width and lesser height. A number of quartz ridges 203 span transversely across the chamber walls and support the walls, especially when the chamber is operated under vacuum. The reaction chamber is enclosed in a shroud that directs cooling air in order that the chamber walls can be controlled to a temperature substantially lower than that of the susceptor. This shroud generally has a suitcase-like arrangement that can be opened, as it is in FIGS. 3A and 3B, to expose the reaction chamber. Visible here are the longer sides 205 and the top 207 of the shroud. Susceptor 215 (not visible in this drawing) is positioned within the reactor. The susceptor 215 is heated by quartz lamps, which are arranged into two arrays of parallel lamps. Upper lamp array 209 is visible in the top of the shroud; a lower array is hidden below the reaction chamber. Portions of the inlet manifold are visible.

Figure 3C:
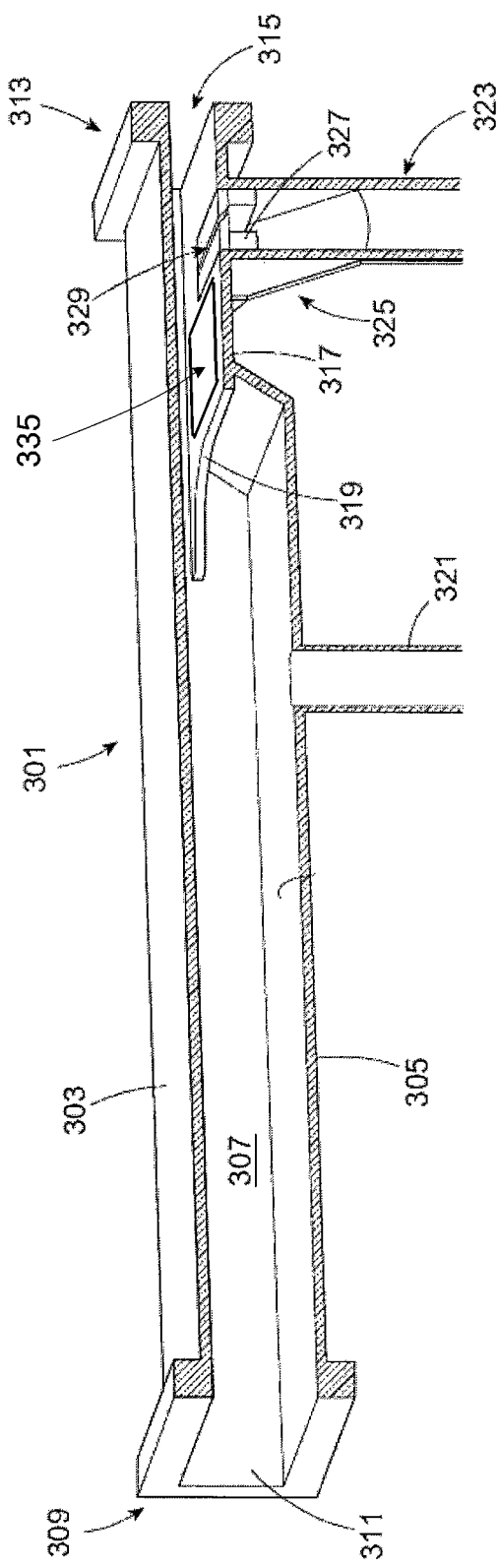

FIG. 3C illustrates a longitudinal cross-section through particularly preferred reaction chamber 301, omitting ribs 203 for clarity. Illustrated here are top quartz wall 303, bottom quartz wall 305 and one quartz side wall 307. Quartz flange 313 seals the inlet end of the reaction chamber 301 to the inlet manifold structures, and quartz flange 309 seals the outlet end of the reaction chamber 301 to the outlet manifold structures. Port 315 provides for entry of process gases, carrier gases, and so forth, and port 311 provides for exit of exhaust gases. The susceptor 215 (not shown) is generally positioned in a semi-circular opening 319 so that its top surface is coplanar with the top of quartz shelf 317. Thereby, a substantially smooth surface is presented to process gases entering from the inlet manifold structures so that these gases can pass across the top of the susceptor 215 without becoming turbulent or being diverted under the susceptor. Cylindrical quartz tube 321 provides for a susceptor support shaft on which the susceptor 215 can rotate. Advantageously, carrier gas can be injected through quartz tube 321 to purge the volume under the susceptor to prevent dead zones where process gases can accumulate. In particular, buildup of GaCl₃ under the heated susceptor 215 is limited.

The inlet manifold structures provide process gases through both port 315 and slit-like port 329. Gases reach port 329 first though quartz tube 323; quartz tube 323 opens into flattened funnel 325, which allows gases to spread transversely (transverse to process gas flow in the reaction chamber); funnel 325 opens into the base of the reaction chamber 25 through a transversely arranged slot in shelf 317.

Figure 6:
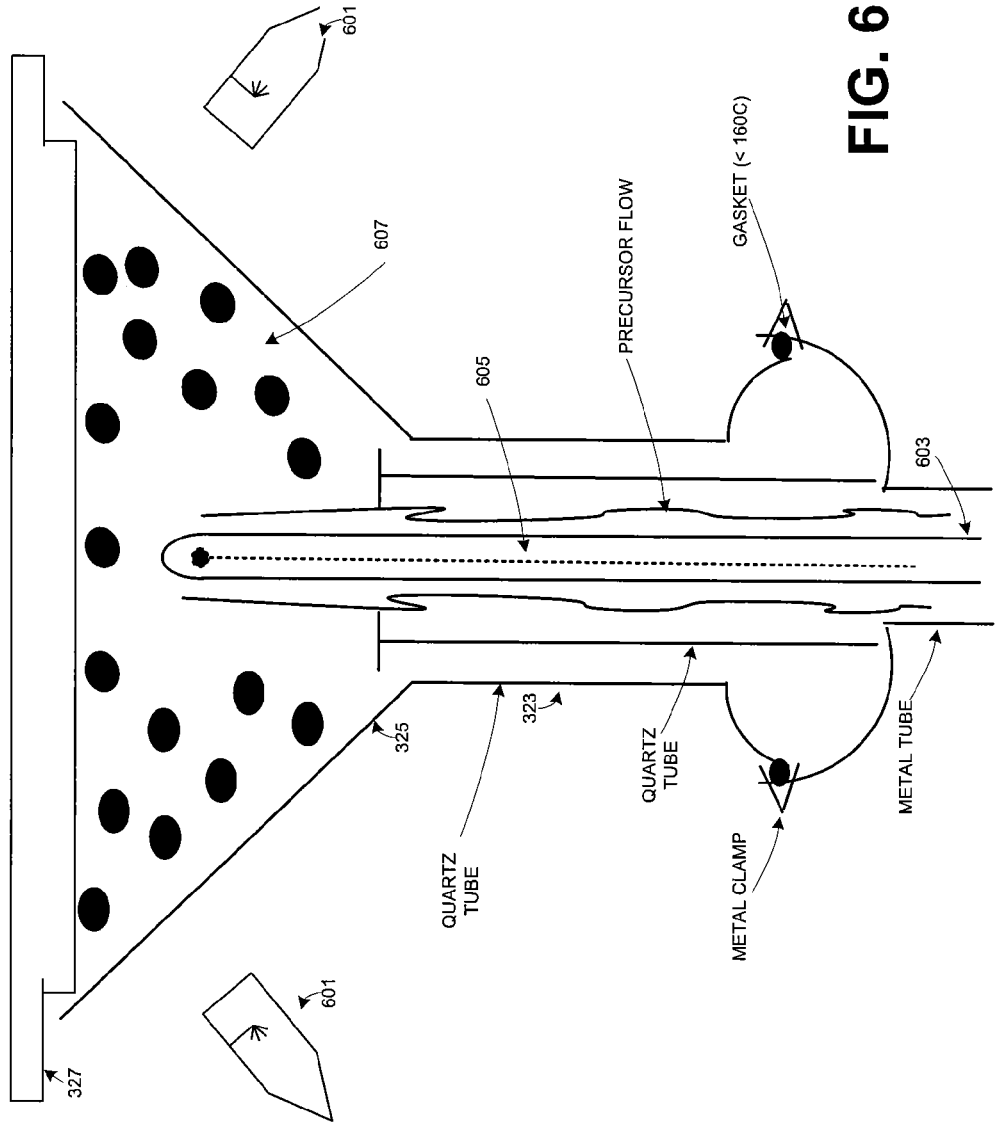
FIG. 6 schematically illustrates an alternative reactant gas inlet arrangement.

With reference to FIG. 6, the funnel 325 is compactly filled with beads of silicon carbide 607 and a silicon carbide insert 327 in the top of the flattened funnel 325 provides slit-like port 329 for entry of GaCl₃ from funnel 325 into the reaction chamber 25. Two IR spot lamps 601 and their reflector optics are located on each side of the funnel 325. A quartz sheath 603 containing a thermocouple 605 is inserted through the bottom of the quartz tube 323 up to about the middle of the funnel height in the middle of the SiC beads 607 in order to enable closed-loop control of the spot lamp power to maintain the SiC beads 607 at a temperature of about 800° C. Preferably, GaCl₃ is introduced through port 329 and NH₃ is introduced through port 315. Alternatively, GaCl₃ can be introduced through port 315 and NH₃ can be introduced through port 329. Alternatively, an RF field may be created as known in the art in a lower portion of tube 323 so that the NH₃ can be activated by the creation of ions or radicals. Alternatively, some or all of the NH₃ can be replaced by N₂, which will be similarly activated by the RF field. An SiC extension plate 335 is disposed between the slit-like port 329 and the edge of the susceptor 215. The SiC extension plate 335 is heated by the main heating lamps to ensure that the dimer does not reform in the gas phase between the slit-like port 329 and the susceptor 215. The temperature of the SiC extension plate 335 should be above 700° C. and preferably above 800° C.

Figure 4:
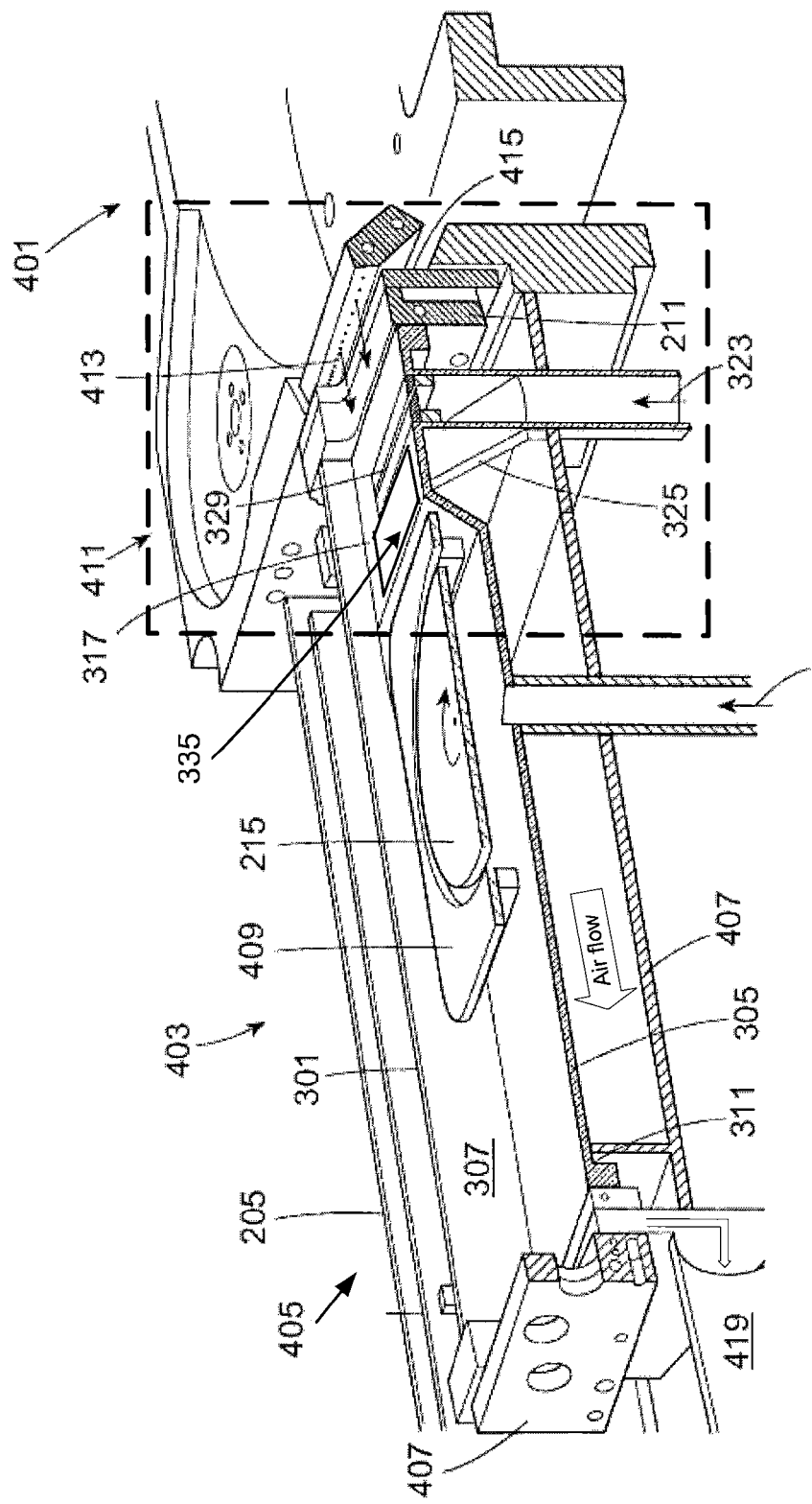
FIG. 4 schematically illustrates preferred transfer/reaction chamber combinations.

FIG. 4 illustrates a diagonally cut-away view of a particularly preferred reaction/transfer chamber assembly comprising wafer transfer chamber 401 assembly mated to reaction chamber assembly 403. Structures that have been previously identified in FIGS. 2 and 3 are identified in FIG. 4 with the same reference numbers. Exemplary wafer transfer chamber 401 houses a robot arm, Bernoulli wand, and other means (not illustrated) for transferring substrates from the outside of the system into the reaction chamber and from the reaction chamber back to the outside. Transfer chambers of other designs can be used in this invention.

The reaction chamber assembly 403 includes reaction chamber 301 mounted within shroud 405. Illustrated here are portions of bottom wall 407 and far wall 205 of the shroud 405. The shroud 405 serves to conduct cooling air over the reaction chamber 301 to maintain a controlled wall temperature. Certain reaction chamber structures have already been described including: bottom wall 305, side wall 307, flange 309 (FIG. 3C) to outlet manifold, shelf 317 (FIG. 3C), susceptor 215, and cylindrical tube 321 for susceptor support and optional purge gas flow. The susceptor 215 rotates in a circular opening 319 in rounded plate 409, which provides lateral stability to the susceptor and is coplanar with shelf 317, SiC extension plate 335 and slit-like port 329. The planarity of these components ensures a smooth gas flow from the gas inlet to the susceptor 215. Outlet manifold structures include plenum 407, which conducts exhaust gases from the reaction chamber 301 in the indicated directions and into exhaust line 419. The outlet manifold and flange 309 on the reaction chamber 301 are sealed together with, e.g., a gasket or O-ring (not illustrated) made from temperature- and chlorine-resistant materials.

Inlet manifold structures (as this term is used herein) are illustrated within dashed box 411. Plenum 211, described below, is sealed to the front flange of the reaction chamber with a gasket or O-ring (not illustrated) or the like made from temperature- and chlorine-resistant materials. Gate valve 413 between the transfer chamber and the reaction chamber rotates clockwise (downward) to open a passage between the two chambers, and counterclockwise (upward) to close and seal the passage between the two chambers. The gate valve can be sealed against face plate 415 by means of, e.g., a gasket or O-ring. The preferred material for the O-ring is the same as that mentioned above for other O-rings. The gate valve preferably also provides ports for gas entry as described below. The structure of the lower gas inlet, as previously described, includes communicating quartz tube 323, flattened funnel 325, and slit-like port 329.

Figure 5:
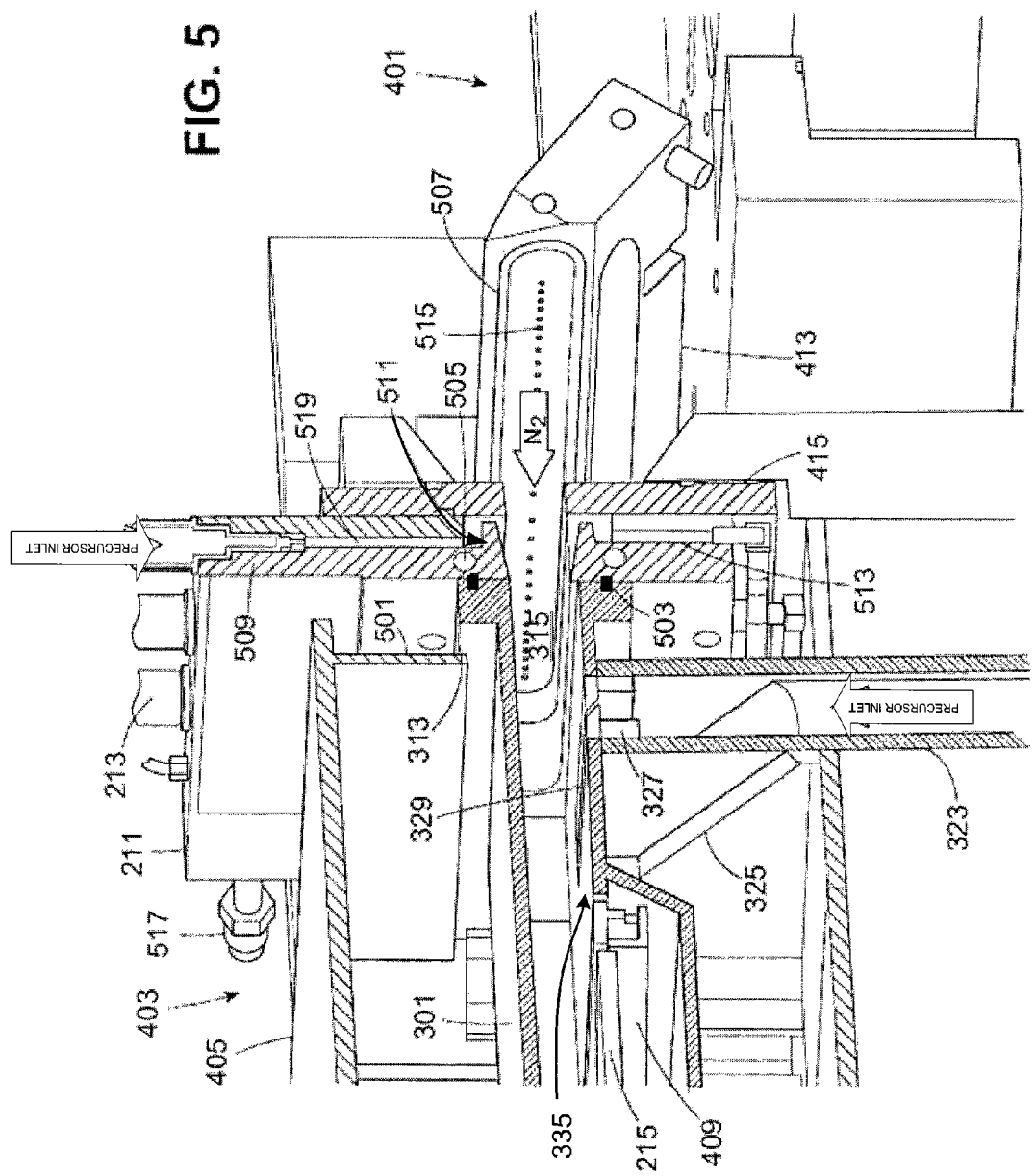
FIG. 5 schematically illustrates preferred inlet manifold structures.

FIG. 5 illustrates details of the particular preferred inlet manifold structures and their arrangement in the reaction chamber assembly. Structures that have been previously identified in FIGS. 2 and 3 are identified in FIG. 5 with the same reference numbers. Considering first the surrounding reaction chamber assembly, reaction chamber assembly 403, including shroud 405 and reaction chamber 301, is at the left, while transfer chamber structures 401 are at the right. Susceptor 215 and susceptor stabilizing plate 409 are inside the reaction chamber 301. Quartz flange 313 of the reaction chamber 301 is urged against plenum structure 211 by extension 501 of shroud 405. The reaction chamber flange and plenum structure 211 are sealed by O-ring gasket 503, which is visible in cross-section on both sides of port 315.

With continued reference to FIG. 5, the inlet structure leading through slit-like port 329 for $GaCl_3$ (preferably, but optionally, $NH_3$ instead) is comprised of a quartz tube 323 and funnel 325 that is longitudinally flattened but extended transversely so that it opens across a significant fraction of the bottom wall of the reaction chamber 301. Small beads or small tubes or any form of a porous IR-absorbent material fill the funnel 325. Insert 327 fits into the upper opening of the funnel 325 and includes slit-like port 329 that is angled toward the susceptor 215 with an extension plate 335 that covers the space between the susceptor 215 and the slit-like port 329. In operation, $GaCl_3$ (and optional carrier gases) move upward in the supply tube, spread transversely in the funnel 325, and is directed by the slit-like port 329 into the reaction chamber 301 and toward the susceptor 215. Thereby, $GaCl_3$ moves from port 329 toward susceptor 215 in a laminar flow substantially uniform across the width of the reaction chamber 301.

Turning attention to inlet structures leading through port 315, these structures include plenum structure 211, face plate 415, and gate valve 413. $NH_3$ (preferably, but optionally, $GaCl_3$ instead) vapor is introduced into the plenum structure 211 through supply line 517 and passes downward toward the reaction chamber 301 through the number of vertical tubes 519. $NH_3$ vapor then exits the vertical tubes 519, or optionally through distributed ports in which each vertical tube 519 is lined to a group of distributed ports, and passes around lip 511 of the plenum 211. Thereby, $NH_3$ vapor moves toward the susceptor in a laminar flow substantially uniform across the width of the reaction chamber 301. Flow through each vertical tube 213 is controlled by a separate valve mechanism 509, all of which are externally adjustable. The plenum 211 also includes tubes for conducting temperature-control fluids, e.g., GALDEN® fluid having temperatures controlled so that the plenum structures 211 through which $NH_3$ passes are maintained within the above-described temperature ranges and so that plenum structures 211 adjacent to O-ring 503 are maintained within the operational range for the sealing materials used in the O-ring 503. As noted, the preferred material for the O-ring 503 is the same as that mentioned above for other O-rings. Temperature control tube 505 is visible (a corresponding tube is also visible below port 315) adjacent to O-ring 503. In typical operation, tube 505 serves to cool the O-ring 503 so that it remains within its operational range.

Gate valve 413 advantageously includes a number of gas inlet ports 515, as well as serving to isolate the reaction and transfer chambers. It is opened and closed to provide controlled access for wafers and substrates between the transfer chamber and the reaction chamber through port 315. It is illustrated in a closed position in which it is sealed to face plate 415 by O-ring 507. In preferred embodiments, gas inlet ports 515 are used to inject purge gases, e.g., $N_2$. Their size and spacing, which here is denser near the edge portions of the gate valve 413 (and reaction chamber 301) and sparser at the central portions of the gate valve 413 (and reaction chamber 301), are designed to improve the uniformity in composition and velocity of the process gases as they flow across the susceptor 215 and build a purge gas curtain along the side walls of the chamber 301 to prevent $GaCl_3$ gas from flowing underneath the susceptor 215 to avoid undesired deposition of GaN in this location.

Generally, for deposition of high-quality epitaxial layers, the inlet manifold and port structures cooperate to provide a process gas flow that is substantially laminar (thus non-turbulent) and that is substantially uniform in velocity and composition. The substantially laminar and uniform flow should extend longitudinally up to and over the susceptor 215 and transversely across the reaction chamber 301 (or at least across the surface of the susceptor). Preferably, process gas flows in the reaction chamber are uniform in velocity and composition across the chamber to at least 5%, or, more preferably, 2% or 1%. Composition uniformity means uniformity of the III/V ratio (i.e., $GaCl_3/NH_3$ ratio). This is achieved by: first, designing the process gas inlet ports to provide an already approximately uniform flow of process gases through the reaction chamber; and second, by designing selective injection of carrier gases to cause the approximately uniform flow to become increasingly uniform. Control of flow downstream from the susceptor is less important.

Numerical modeling of the gas flow dynamics of the particularly preferred embodiment has determined a preferred process gas inlet port configuration so that a substantially uniform flow is produced. Guidelines for total process gas flow rates are established according to the selected GaN deposition conditions and rates needed for intended sustained, high-throughput operation. Next, within these overall flow guidelines, insert 327 and slit 329 have been designed so the modeled $GaCl_3$ flow into the reaction chamber 301 is substantially uniform across the reaction chamber. Also, modeling of intended $GaCl_3$ flows has indicated that after the $NH_3$ vapor emerges around lip 511 into the reaction chamber 301, this flow also becomes substantially uniform across the reaction chamber. Further, valves 509 can be controlled to ameliorate non-uniformities that may arise during operation.

Further, guided by numerical modeling, secondary carrier gas inlets have been added to increase the uniformity of the primary-process gas flows. For example, in the particularly preferred embodiment, it has been found that supply of purge gases through gate valve 413 provides improvement by preventing accumulation of high concentrations of $GaCl_3$ vapor between the face of gate valve 413 and lip 511 (i.e., the regions enclosed by face plate 415). Also, it has been found that arranging inlets to provide greater carrier gas flow at the edges of the reaction chamber 301 and lesser purge gas flow at the center also improves uniformity of composition and velocity of flow at the susceptor 215 and better maintains the reactive gas above the surface of the susceptor.

EXAMPLE

The invention is now compared to a standard or conventional HVPE system to illustrate the advantages and unexpected benefits that are provided when conducting HVM of Group III-V material according to the invention. Prior to setting forth this comparison and by way of introduction, conventional HVPE systems are first briefly described in relevant part.

A conventional HVPE system consists of a hot-wall tube furnace usually fabricated of quartz. The Group III precursor is formed in situ in the reactor by flowing HCl over a boat holding the Group III metal in a liquid form. The Group V precursor is supplied from external storage, e.g., a high-pressure cylinder. Conventional HVPE has been used for the growth of arsenide, phosphide and nitride semiconductors. For the growth of GaN, the Group III source is typically molten Ga in a quartz boat (with which the HCl reacts to form GaCl), and the Group V source is usually ammonia gas.

In more detail, the quartz tube can be oriented either vertically or horizontally. The surrounding furnace is usually of a resistive type with at least two temperature zones: one for maintaining the Group III metal at a temperature above its melting point; and the other for maintaining the substrate/wafer at a sufficiently high temperature for epitaxial growth. The Group III metal source equipment including a boat for liquid Group III metal, the substrate/wafer holder, and gas inlets are placed and arranged in one end of the quartz furnace tube; the other end serves for exhausting reaction by-products. All this equipment (or at least that which enters the furnace tube) must be fabricated of quartz; stainless steel cannot be used. Most reactors process only one wafer at a time at atmospheric pressure. Multiple wafers must be arranged in a reactor so that the surfaces of all wafers are directly in line with the gas flow in order to achieve uniform deposition.

Wafers are loaded by first placing them on a substrate support and then by positioning the substrate support into a high-temperature zone in the quartz furnace tube. Wafers are unloaded by removing the support from the furnace and then lifting the wafer off the support. The mechanism for positioning the substrate support, e.g., a push/pull rod, must also be fabricated of quartz since they are also exposed to full growth temperatures. Supported wafers, the substrate support, and the positioning mechanism must be positioned in the usually hot reactor tube with great care in order to prevent thermal damage, e.g., cracking of the wafers and/or substrate support. Also, the reactor tube itself can be exposed to air during wafer loading and unloading.

Such conventional HVPE reactors are not capable of the sustained high-volume manufacturing that is possible with the HVM methods and systems of this invention for a number of reasons. One reason is that the reactors of this invention require less unproductive heating and cooling time than do conventional HVPE reactors because they can have considerably lower thermal masses. In the reactors of this invention, only the susceptor (substrate/wafer support) needs to be heated, and it is heated by rapidly acting IR lamps. Heating and cooling can thus be rapid. However, in conventional HVPE reactors, the resistive furnace can require prolonged heating and (especially) cooling times, up to several to tens of hours. During such prolonged heating and cooling times, this system is idle, and wafer production, reactor cleaning, system maintenance, and the like must be delayed. Furthermore, despite risks of thermal damage, wafers are usually placed in and removed from the reactor when it is near operating temperatures to avoid further heating and cooling delays. For these reasons, the systems and methods of this invention can achieve higher throughputs than can conventional HVPE systems.

Another reason limiting the throughput of conventional HVPE systems is that such systems require considerably more reactor cleaning that do the reactors of this invention. Because all internal components of conventional HVPE reactors are heated by the external resistive furnace, Group III-V material can grow throughout the inside of the reactor, not only on the substrate where it is desired. Such undesired deposits must be frequently cleaned from the reactor or else they can form dust and flakes that contaminate wafers. Cleaning requires time during which the reactor is not productive.

Also, the Group III precursor is inefficiently used; most is deposited on the interior of the reactor; a small fraction is deposited on the substrate wafer as desired; and little or none appears in the reactor exhaust where it might be recycled for reuse. The Group V precursor is also inefficiently used, and excess can react with unused HCl to form chlorides (e.g., $NH_4Cl$) that can deposit on cold areas downstream of the reaction zone. Such chloride deposits must also be cleaned from the reactor.

In contrast, the reactors of this invention have temperature-controlled walls so that little or no undesired growth of Group III-V material occurs. Reactors of this invention can be more productive since unproductive cleaning and maintenance either can be shorter, or need not be as frequent, or both. Also, for these reasons, the systems and methods of this invention can achieve higher throughputs than can conventional HVPE systems.

Another reason limiting the throughput of conventional HVPE systems is that their conventional internal Ga sources require recharging (with liquid Ga or other Group III metal) considerably more frequently than do the external Ga sources of this invention (which are recharged with the Ga precursor $GaCl_3$). The external source of this invention delivers a flow of Ga precursor that can be controlled in both rate and composition at maximum sustained rates up to approximately 200 gm/hr or greater. Since the capacity of the external source is not limited by reactor geometry, it can be sufficient for many days or weeks of sustained production. For example, an external source can store up to many tens of kilograms of Ga, e.g., approximately 60 kg, and multiple sources can be operated in series for essentially unlimited sustained production.

In conventional HVPE systems, the Ga source has a strictly limited capacity. Since the source must fit inside the reactor and can be no larger than the reactor itself, it is believed that an upper limit to a conventional source is less than 5 kg of Ga. For example, for 3 kg of Ga, a boat of approximately 7×7×20 cm filled with liquid Ga 4 cm deep is required. Disclosure of such a large Ga boat has not heretofore been found in the prior art. Further, the rate and composition of the source cannot be well controlled, because the Ga precursor (GaCl) is formed in situ by passing HCl and over the liquid Ga in the Ga source boat inside the reactor. The efficiency of this reaction is dependent upon reactor geometry and exact process conditions, e.g., the temperature in the source zone, and various efficiency values from 60% to over 90% have been reported. Furthermore, as the level of the Ga decreases and as the Ga source ages, the flux of GaCl to the deposition zone can vary even with constant process conditions. For these reasons also, the systems and methods of this invention can achieve higher throughputs than can conventional HVPE systems.

Another reason limiting the throughput of conventional HVPE systems is that heretofore, their construction is not standardized and, in fact, such systems are often individually designed and fabricated for specific users. Lack of standardization leads to, for example, slow and complex maintenance. Because they can often include complex and fragile quartz components that are difficult to work with, such reactors are time-consuming to disassemble and reassemble. In particular, the Group III source zone is intricate as it contains a separate quartz inlet for HCl, a quartz boat positioned adjacent to the HCl inlet, a separate quartz inlet for the Group V precursor (which must be kept separate from the Group III precursor), and a possible additional quartz inlet for a carrier gas. In contrast, the systems and methods of the present invention are, to a great extent, adaptations of tested and standardized designs known for Si processing, which have been optimized for efficient operation and maintenance and which include commercially available components. For example, the particularly preferred embodiment includes a Group III source zone with a gate valve and Group III precursor plenum and inlet ports partially fabricated from metal. The gate valve requires only a short time to open and close, and the Group III precursor plenum and inlet ports are considerably less fragile. For these reasons also, the systems and methods of this invention can achieve higher throughputs than can conventional HVPE systems.

The qualitative design choices that differentiate systems of this invention from conventional HVPE systems leads to surprising quantitative benefits in epitaxial growth efficiencies, reactor utilizations and wafer production rates, and precursor utilization efficiencies. These surprising quantitative benefits are reviewed below using the data in Tables 1, 2, and 3, which compare a conventional HVPE system designed to handle one 100-millimeter-diameter substrate and including a reactor tube of about 20 cm in diameter and about 200 cm in length with a corresponding system of this invention.

Considering first achievable epitaxial growth efficiencies, the data of Table 1 demonstrate that the HVM systems of this invention can be considerably more efficient than conventional HVPE systems.

TABLE 1

| Epitaxial growth efficiencies | | | |
|---|---|---|---|
| | | Conventional HVPE | HVM |
| Epitaxial growth efficiencies Reactor Information | | | |
| Wafer diameter | cm | 15 | 15 |
| Reactor length | cm | 200 | |
| Reactor diameter | cm | 20 | |
| Hot zone length | cm | 40 | |
| # wafers processed simultaneously | | 1 | 1 |
| Reactor production times wafer load/unload time | | | |
| Pull/push rate | cm/min | 2 | |
| Total pull and push length | cm | 160 | 0 |
| Total pull and push time | min | 80 | 2 |
| Wafer load/unload time | min | 9.5 | 2 |
| Total load/unload time | min | 89.5 | 3 |
| Operation overhead | % | 10% | 10% |
| Total load/unload time in cont. operation | min | 52.0 | 2.2 |
| epitaxial growth time | | | |
| Time to grow template | min | 0 | 0 |
| Growth rate | um/hr (um/min) | 200 (3.3) | 200 (3.3) |
| Layer thickness | um | 300 | 300 |
| Time to heat and cool | min | 0 | 6 |
| Time to grow layer | min | 90 | 90 |
| Operation overhead | % | 10% | 10% |
| Total growth time | min | 99 | 106 |
| Total wafer-in-reactor time | min | 151.0 | 107.8 |
| Reactor utilization (R.U.) | | | |
| R.U. - growth time/ wafer-in-reactor time | % | 66% | 98% |

Epitaxial growth efficiencies can be represented by the ratio of the actual epitaxial growth times to the sum of the actual epitaxial growth times and the reactor load/unload times. It can be seen that the HVM systems and methods of this invention can be loaded/unloaded significantly faster than can conventional HVPE systems, and thus can achieve higher epitaxial growth efficiencies. It is also expected that in actual operation, the external Ga sources of this invention will allow sustained operation for considerably longer periods than possible with conventional systems.

Because, in conventional HVPE systems, the reactor is maintained at near deposition temperature between runs, the substrate must be pulled from or pushed into the reactor at a slow enough rate to avoid thermal damage. Assuming that distance of the substrate holder from the reactor inlet is about 80 cm and a pull rate of no more than 2 cm/min. to avoid thermal damage, about 40 minutes are required to pull the substrate from, and also to push the substrate into, the reactor. Further, once the substrate and wafer are positioned in the reactor, up to 10 minutes can be required for thermal stabilization, reactor purge, and set-up of process gases. (With load locks, the purge and gas setup might require 5 minutes each; without load locks, setup would be much longer.) Thus, the total load/unload time is about 90 minutes, or 52 minutes in continuous production (where some times would be shared equally between two successive runs).

In contrast, in the HVM systems of this invention, wafers can be rapidly loaded/unloaded at lower temperatures without risk of thermal damage, thus eliminating extended wafer positioning times. Because of their low thermal mass and IR-lamp heating, reactors used (and specifically, the susceptor and wafer in such reactors) in the HVM systems and methods of this invention can be rapidly cycled between higher deposition temperatures and lower temperatures loading/unloading temperatures. Therefore, the HVM systems and methods of this invention achieve considerably shorter loading/unloading times than are possible in conventional HVPE reactors.

Once loaded and assuming Ga precursor sources used in conventional HVPE systems are able to maintain an adequate mass flow rate of precursor, actual epitaxial growth times of conventional systems and of the systems of this invention are of approximately the same magnitude. However, it is expected that the Ga precursor source used in the HVM systems and methods of this invention has significant advantages over Ga precursor source used in conventional HVPE systems, so that in actual operation, the systems and methods of this invention will achieve relative epitaxial growth efficiencies even greater than the efficiencies presented in Table 1.

For example, even if capable of adequate mass flow for an initial period, it is unlikely that conventional Ga sources can sustain adequate mass flow for extended periods. Conventional HVPE systems generate Ga precursor in situ to the reactor by the passing HCl gas over metallic gallium in a liquid form. Because the efficiency of this process depends strongly on reactor geometry and process conditions (e.g., from about 60% to over about 90% depending on Ga temperature), the actual mass flow of Ga precursor (GaCl) will also vary. Further, as the level of the Ga decreases and the Ga source ages, the flux of Ga precursor can vary, even with constant process conditions (e.g., constant temperature and input HCl flux). Further, conventional Ga sources (in particular, the liquid Ga boat) must be within the reactor, and their capacities are thus constrained by reactor geometry. The largest boat believed to be reasonably possible (and not believed to be disclosed in the known prior art) in a conventional HVPE system could hold no more than about approximately 3 to 5 kg and would be approximately 7×7×20 cm in size and be filled 4 cm deep with liquid Ga.

In contrast, the HVM systems and methods of this invention employ an external Ga source that can provide constant, unvarying flow of Ga precursor at up to 200 gm of Ga/hr and greater (sufficient to support growth rates in excess of 300 μm/hr) that can be sustained for extended periods of time. First, this source can provide $GaCl_3$ vapor in a manner so that the Ga mass flux can be measured and controlled even during epitaxial growth. Second, this external Ga source is capable of sustained, uninterrupted operation because Ga precursor is supplied from a reservoir holding tens of kilograms of precursor. Additionally, multiple reservoirs can be operated in series for effectively unlimited operation.

In summary, relative epitaxial growth efficiencies can be summarized by reactor utilization (R.U.) defined by the fraction of the time that a wafer is in the reactor during which actual growth is occurring. It is seen that the HVM systems and methods of this invention achieve such an R.U. of about 95% or more, while conventional HVPE systems can achieve such an R.U. of no more than about 65%. It is expected that the HVM systems and methods of this invention will achieve even greater relative epitaxial growth efficiencies in actual operation.

Next, considering first achievable reactor utilizations and wafer production rates, the data of Table 2 demonstrate that the HVM systems of this invention can be more efficient than conventional HVPE systems.

TABLE 2

Reactor utilizations and achievable wafer production rates

|  |  | Conventional HVPE | HVM |
|---|---|---|---|
| Reactor maintenance times and wafer production rates in-situ reactor cleaning time | | | |
| # runs between in-situ cleaning | | 5 | 5 |
| Time to open/close reactor | min | 26.6 | 2 |
| Total thickness to be etched | um | 1500 | 300 |
| Etch rate | um/min | 8 | 8 |
| Etch time | min | 187.5 | 18.8 |
| bake time | min | 30 | 15 |
| Time to load Ga with in-situ etch | min | 45 | 0.0 |
| Operation overhead | % | 18% | 15% |
| Total in-situ cleaning time | min | 339.8 | 41.1 |
| ex-situ reactor cleaning time | | | |
| # runs between ex-situ cleaning | | 15 | 15 |
| time to close reactor after unloading | min | 13.3 | 1.0 |
| time to cool reactor | min | 180 | 20 |
| time to take reactor apart | min | 120 | 120 |
| time to put reactor back together | min | 180 | 120 |
| time to leak check and other | min | 45 | 45 |
| Time to load Ga with ex-situ etch | min | 10 | 0 |
| time to heat reactor | min | 75 | 20 |
| Wafer testing time | min | 60 | 60 |
| Preventive maintenance | min | 120 | 120 |
| Operation overhead | % | 25% | 20% |
| Total ex-situ cleaning time | min | 959.2 | 571.2 |
| Reactor utilization (R.U.) and wafer production rate | | | |
| R.U. - wafer-in-reactor time/ total use time | % | 59% | 76% |
| R.U. - growth time/total use time | % | 39% | 75% |
| # runs (wafers) | | 15 | 15 |
| total use time for #runs (wafers) | min | 3734 | 1996 |
| # wafers/hour | | 0.24 | 0.45 |
| # hours/wafer | | 4.15 | 2.22 |
| # wafers/24 hours | | 5.8 | 10.8 |

Reactors must be periodically taken out of production for cleaning and preventive maintenance. Since the HVM systems and methods of this invention can be rapidly cleaned and maintained, they can achieve higher reactor utilizations and wafer production rates than can conventional HVPE systems.

During operation, materials grow on undesired locations in the reactor, e.g., on the reactor walls and on other internal reactor components, and excessive growth of these materials can cause problems, e.g., wafer contamination. Cleaning is required to remove these undesired materials, and can be performed either in situ, that is, without disassembling the reactor, or ex situ, after disassembling the reactor. In situ cleaning is often performed by etching undesired deposits with HCl. After a number of in situ etchings or cleanings, more thorough ex situ cleaning is advantageous.

HVM systems of this invention require considerably less in situ cleaning time than conventional HVPE systems. The reactors of this invention have walls with controlled lower temperatures so that little material deposits thereon during wafer production. In contrast, conventional HVPE reactors operate at higher deposition temperatures so that the same amount of material grows on reactor walls and internal reactor parts as grows on the wafers and substrates. Table 2 presents a scenario that assumes that no more than 1.5 mm of unwanted GaN can be allowed to deposit on reactor walls and internal reactor parts.

For conventional HVPE systems, in situ cleaning is required every 5 runs, during which 1.5 mm of unwanted GaN (300 μm per run) will have grown on the reactor interior. In contrast, if in situ cleaning of the reactors of this invention is also performed every 5 runs, only a nominal amount (e.g., 20% or less of the amount that will have grown in conventional HVPE systems) of GaN will have grown on the reactor interior. (In fact, in situ cleaning of the HVM systems of this invention could reasonably be delayed to only every 15 runs.) Therefore, in situ cleaning times of conventional HVPE reactors are at least 5 times (and up to 15 times) longer than the in situ cleaning time of the HVM reactors of this invention.

In addition, the HVM systems of this invention require considerably less ex situ cleaning time than conventional HVPE systems. First, these HVM systems have significantly shorter cooling/heating times that must precede and follow, respectively, ex situ cleaning. Also, their disassembly/cleaning/reassembly times are similar to the shorter times known for Si processing systems, because the HVM systems and methods of this invention comprise commercially available designs and components already known for Si processing. The designs and components incorporated from Si processing systems include: rapidly acting reactor gates, fully automated wafer handling with cassette-to-cassette loading, the ability to perform hot load/unload, separate cooling stages, in situ growth rate monitoring and load locks to prevent exposure of the reactor to atmosphere.

And, as already discussed, the Ga precursor sources, i.e., the Ga boat, used in conventional HVPE systems must be periodically recharged in order for both to maintain constant precursor flow and also because of their limited capacity. This precursor recharging, which can be performed during cleaning, further lengthens cleaning times of these conventional systems. In contrast, the external Ga sources of the HVM systems and methods of this invention can operate with little or no interruption for extended periods of time.

In summary, reactor maintenance times can be summarized by a further R.U. and a wafer production rate. This second R.U. represents the ratio of the time that a wafer is in the reactor to the sum of the times that a wafer is in the reactor plus the cleaning/maintenance times. It can be seen that the HVM system and methods of this invention achieve an R.U. of about 75% or more, while conventional HVPE systems can achieve such an R.U. of no more than about 60%.

Relative system efficiencies can be represented by wafer production rates, which can be derived by dividing a number of wafers produced by the total time required to produce these wafers. Since a complete cycle of wafer production runs, in situ cleanings, and ex situ cleanings comprise 15 runs (according to the assumptions of Tables 1 and 2), these rates are determined by dividing 15 by the total time for producing 15 wafers (including load/unload time, in situ cleaning time, ex situ cleaning time, maintenance time, and source recharge time). It can be seen that the total time the HVM systems and methods of this invention require to produce 15 wafers (runs) is considerably shorter than the total time required by conventional HVPE systems. Therefore, the systems and methods of this invention achieve an approximately two-fold throughput improvement over the prior art. As discussed above, a greater throughput improvement is expected during actual operation.

Lastly, considering comparative precursor efficiencies, the HVM systems and methods of this invention utilize precursors, especially Ga precursors, more efficiently than conventional HVPE systems. This is exemplified by the data in Table 3.

TABLE 3

Precursor utilizations

|  |  | Conventional HVPE | HVM |
|---|---|---|---|
| Precursor utilization ammonia (both processes) | | | |
| Ammonia Flow | slpm | 14 | 10 |
| Total ammonia flow time | min | 132.0 | 97.7 |
| Total ammonia for 90 min. run | mole | 82.5 | 43.6 |
| HCl (convention HVPE) | | | |
| Moles of HCl/min during run | mole/min | 0.024 | |
| Liters HCl used in run | liter | 51.2 | |
| gallium (convention HVPE) | | | |
| Input V/III ratio | | 30 | |
| Moles/min of ammonia during run | mole/min | 0.6250 | |
| Moles/min of Ga required by ammonia flow | mole/min | 0.0208 | |
| Conversion of $GaCl_x$ to GaN | % | 95% | |
| Actual moles/min of Ga used in run | mole/min | 0.0219 | |
| Additional moles of Ga | % | 10% | |
| moles of Ga/min for run | mole/min | 0.024 | |
| Weight of Ga/min for run | gm/min | 1.76 gm Ga/min; 100 gm Ga/hr | |
| Weight of Ga per run | gm | 151.4 | |
| gallium (HVM) | | | |
| Input V/III ratio | | | 30 |
| moles of ammonia/min during run | mole/min | | 0.4464 |
| moles/min of Ga to meet V/III | mole/min | | 0.0149 |
| Conversion of $GaCl_x$ to GaN | % | | 95% |
| moles of $GaCl_3$ dimer/min required to meet V/III | mole/min | | 0.0082 |
| Additional moles of $GaCl_3$ dimer | % | | 10% |
| Total moles $GaCl_3$ dimer for run | mole | | 0.82 |
| Atomic weight $GaCl_3$ dimer | gm/mole | | 352.2 |
| Total weight of $GaCl_3$ dimer for run | gm | | 287.4 |
| Percent of $GaCl_3$ dimer that is Ga | % | | 40% |
| Weight of Ga for run | gm | | 114 |
| Weight of Ga/hour for run | gm | | 75 gm Ga/hr |
| Ga utilization | % | 21% | 25% |
| Utilization with Ga recycling (est.) | % | 27% | 80% |

Ga utilization is determined in Table 3 first by considering that a conventional HVPE system suitable for a 15 cm wafer can be expected to use approximately 14 slpm (standard liters per minute) of ammonia. Assuming a V/III ratio of 30 and a 95% conversion of the Ga precursor into GaN, the conventional system can be expected to use approximately 1.8 gm/min. of Ga. A 90-minute run sufficient to grow 300 µm of GaN at 200 µm/hr, therefore, requires about 151 gm of Ga. Since there is about 31 gm of Ga in a 300 µm layer on a 15 cm wafer, the Ga efficiency of the conventional HVPE reactor is approximately 21% (=31/151). Since most of the remaining 120 gm (=151−31) is deposited on the insides of the reactor, little is thus unavailable for recycling and reuse. It is expected that even with recycling and reuse of Ga exhausted from the reactor, the Ga efficiency of the conventional HVPE reactor is no more than approximately 25%.

In contrast, HVM systems and methods can be expected to use a lower ammonia flow (e.g., 10 slpm) and, therefore, a lower Ga flow and a lower total Ga required for a 15 cm wafer (e.g., 114 gm). Therefore, the HVM systems and methods of this invention can achieve Ga efficiencies of 27% (=31/114) without recycling and reuse and up to perhaps 80% or greater Ga efficiency with recycling and reuse of Ga exhausted from the reactor. Additionally, since little of the remaining 83 gm (=114−31) is deposited on the insides of the reactor, most of this unused Ga appears in the reactor exhaust where it is available for recycling and reuse. It is expected that with recycling and reuse of exhaust Ga, the Ga efficiency of the HVM systems and methods of this invention can reach 80% or greater.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternative useful combinations of the elements described, will become apparent to those skilled in the art from the subsequent description. Such modifications are also intended to fall within the scope of the appended claims. In the following (and in the application as a whole), headings and legends are used for clarity and convenience only.

A number of references are cited herein, the entire disclosures of which are incorporated herein in their entirety by this reference for all purposes. Further, none of the cited references, regardless of how characterized above, is admitted as prior art to the invention of the subject matter claimed herein.

What is claimed is:

1. A system for forming a Group III-V semiconductor material comprising gallium, the system comprising:
    a reaction chamber comprising:
        a non-planar, infrared-transparent floor comprising a lower region integral and continuous with an elevated region;
        a stabilizing plate laterally adjacent the elevated region of the non-planar, infrared-transparent floor and overlying the lower region of the non-planar, infrared-transparent floor;
        a susceptor positioned within an opening in the stabilizing plate;
        a slit-shaped inlet extending through the elevated region of the non-planar, infrared-transparent floor and configured to provide a reactant toward the susceptor through substantially uniform laminar flow;
        at least one additional inlet proximate the slit-shaped inlet; and
        an infrared-absorbent plate laterally between the slit-shaped inlet and the stabilizing plate;
    heating structures external to the reaction chamber and configured to heat at least one gaseous gallium trichloride precursor to at least 700° C. to decompose substantially all dimers, trimers or other molecular variations of the at least one gaseous gallium trichloride precursor into its monomer form, the heating structures comprising at least one infrared radiation source and at least one infrared absorbent material;
    a source of the at least one gaseous gallium trichloride precursor external to the reaction chamber and in fluid communication with the slit-shaped inlet; and
    a source of gaseous ammonia external to the reaction chamber and in fluid communication with the at least one additional inlet.

2. The system of claim 1, wherein the source of the at least one gaseous gallium trichloride precursor is configured and sized to continuously deliver the gaseous gallium trichloride at a mass flow of at least 50 g gallium/hour.

3. The system of claim 1, further comprising a funnel-shaped nozzle subjacent the slit-shaped inlet.

4. The system of claim 3, wherein the heating structures comprise:
    radiation-absorbent heat-transfer beads within the funnel-shaped nozzle that, when heated, also heat a gaseous reactant flowing around and/or through the beads prior to entry into the reaction chamber; and
    a radiant energy source operatively associated with the radiation-absorbent heat-transfer beads.

5. The system of claim 3, wherein the funnel-shaped nozzle is largest at an end thereof proximate the slit-shaped inlet.

6. The system of claim 3, wherein the reaction chamber further comprises an insert positioned at least partially in an upper opening of the funnel-shaped nozzle, the insert defining the slit-shaped inlet.

7. The system of claim 1, wherein the reaction chamber includes a substrate on the susceptor.

8. The system of claim 1, wherein the at least one infrared absorbent material comprises silicon carbide.

9. The system of claim 1, wherein the at least one infrared radiation source comprises at least one infrared lamp.

10. The system of claim 1, wherein the slit-shaped inlet is sized to extend across a majority of an internal width of the reaction chamber.

11. The system of claim 1, wherein top surfaces of each of the susceptor, the stabilizing plate, the infrared-absorbent plate, and the elevated region of the non-planar, infrared-absorbent floor are substantially coplanar with one another.

12. The system of claim 1, wherein the infrared-absorbent plate comprises a silicon carbide plate.

13. The system of claim 1, wherein the infrared-absorbent plate is embedded within an portion of the elevated region of the non-planar, infrared-transparent floor.

14. The system of claim 1, wherein the non-planar, infrared-transparent floor comprises a non-planar quartz floor.

15. The system of claim 1, wherein the at least one additional inlet comprises a plurality of inlets operatively associated with a gate valve configured to seal a port in the reaction chamber and to facilitate the insertion and removal of substrates into and from the reaction chamber through the port.

16. The system of claim 1, wherein the slit-shaped inlet comprises a perforated rectangular insert extending through a rectangular port in the elevated region of the non-planar, infrared-transparent floor and into an end of a funnel structure exhibiting substantially planar sidewalls diverging outwardly from a tubular structure.

17. The system of claim 16, wherein the at least one infrared absorbent material comprises silicon carbide beads packed within the funnel structure, and wherein the at least one infrared radiation source comprises infrared spot lamps positioned adjacent the substantially planar sidewalls of the funnel structure.

18. The system of claim 17, further comprising a quartz sheathed thermocouple extending into the silicon carbide beads from an end of the tubular structure.

* * * * *